United States Patent
Roussillon et al.

(10) Patent No.: US 8,631,757 B2
(45) Date of Patent: Jan. 21, 2014

(54) SOLUTION DEPOSITION ASSEMBLY

(75) Inventors: Yann Roussillon, Sunnyvale, CA (US);
Jeremy H. Scholz, Sunnyvale, CA (US);
Addison Shelton, Sunnyvale, CA (US);
Geoff T. Green, Belmont, CA (US);
Piyaphant Utthachoo, San Jose, CA (US)

(73) Assignee: Nanosolar, Inc., San Jose, CA (US)

( * ) Notice: Subject to any disclaimer, the term of this patent is extended or adjusted under 35 U.S.C. 154(b) by 914 days.

(21) Appl. No.: 12/369,524

(22) Filed: Feb. 11, 2009

(65) Prior Publication Data

US 2010/0050935 A1 Mar. 4, 2010

Related U.S. Application Data

(63) Continuation of application No. 12/253,900, filed on Oct. 17, 2008, now abandoned.

(60) Provisional application No. 60/980,757, filed on Oct. 17, 2007, provisional application No. 61/027,817, filed on Feb. 11, 2008.

(51) Int. Cl.
*B05C 9/14* (2006.01)
*B05C 3/02* (2006.01)
*B05C 5/00* (2006.01)
*B05B 3/00* (2006.01)

(52) U.S. Cl.
USPC ............ 118/58; 118/300; 118/323; 118/407; 118/415

(58) Field of Classification Search
USPC ........... 118/300, 58, 641–643, 321, 323, 400, 118/407, 410, 411, 412, 415; 427/421.1, 427/422, 427.1, 427.3
See application file for complete search history.

(56) References Cited

U.S. PATENT DOCUMENTS

| | | |
|---|---|---|
| 4,426,266 A | 1/1984 | Ukena et al. |
| 4,798,660 A | 1/1989 | Ermer et al. |
| 4,915,745 A | 4/1990 | Pollock et al. |
| 5,410,796 A | 5/1995 | Weeks, Jr. |
| 5,476,811 A | 12/1995 | Fujii et al. |
| 5,997,956 A | 12/1999 | Hunt et al. |
| 6,048,442 A | 4/2000 | Kushiya et al. |
| 6,092,669 A | 7/2000 | Kushiya et al. |

(Continued)

OTHER PUBLICATIONS

Notice of Allowance and Fees dated Jul. 28, 2011 for U.S. Appl. No. 12/203,117.

(Continued)

*Primary Examiner* — Yewebdar Tadesse
(74) *Attorney, Agent, or Firm* — Joshua D. Isenberg; JDI Patent

(57) ABSTRACT

Methods and devices are provided for improved deposition systems. In one embodiment of the present invention, a deposition system is provided for use with a solution and a substrate. The system comprises of a solution deposition apparatus; at least one heating chamber; at least one assembly for holding a solution over the substrate; and a substrate curling apparatus for curling at least one edge of the substrate to define a zone capable of containing a volume of the solution over the substrate. In another embodiment of the present invention, a deposition system for use with a substrate, the system comprising a solution deposition apparatus; at heating chamber; and at least assembly for holding solution over the substrate to allow for a depth of at least about 0.5 microns to 10 mm.

20 Claims, 21 Drawing Sheets

(56) References Cited

U.S. PATENT DOCUMENTS

| | | |
|---|---|---|
| 6,383,359 B2 | 5/2002 | Arao et al. |
| 6,537,845 B1 | 3/2003 | McCandless et al. |
| 6,547,876 B2 | 4/2003 | Ferguson et al. |
| 6,923,625 B2 | 8/2005 | Sparks |
| 2001/0006734 A1 | 7/2001 | Demiryont |
| 2006/0054039 A1* | 3/2006 | Kritchman et al. ........ 101/424.1 |
| 2006/0071966 A1* | 4/2006 | Nagashima .................... 347/20 |
| 2009/0120359 A1 | 5/2009 | Roussillon et al. |

OTHER PUBLICATIONS

Office Action dated Feb. 8, 2011 for U.S. Appl. No. 12/203,117.

* cited by examiner

SOLUTION DEPOSITION ASSEMBLY

CROSS-REFERENCE TO RELATED APPLICATION

This application is a continuation of U.S. application Ser. No. 12/253,900 filed Oct. 17, 2008 now abandoned which claims priority to U.S. Provisional Application Ser. No. 60/980,757 filed Oct. 17, 2007 and U.S. Provisional Application Ser. No. 61/027,817 filed Feb. 11, 2008. All applications listed above are fully incorporated herein by reference for all purposes.

This invention was made with Government support under Contract No. DE-FC36-07GO17047 awarded by the Department of Energy. The Government has certain rights in this invention.

FIELD OF THE INVENTION

This invention relates generally to deposition systems, and more specifically, solution deposition systems for use in forming photovoltaic devices.

BACKGROUND OF THE INVENTION

Solar cells and solar modules convert sunlight into electricity. These electronic devices have been traditionally fabricated using silicon (Si) as a light-absorbing, semiconducting material in a relatively expensive production process. To make solar cells more economically viable, solar cell device architectures have been developed that can inexpensively make use of thin-film, light-absorbing semiconductor materials such as copper-indium-gallium-di-(sulfo-selenide, $Cu(In, Ga)(S, Se)_2$, also termed CI(G)S(S). This class of solar cells typically has a p-type absorber layer sandwiched between a back electrode layer and an n-type junction partner layer. The back electrode layer is often Mo, while the junction partner is often CdS. A transparent conductive oxide (TCO) such as zinc oxide $(ZnO_x)$ typically doped with aluminum is formed on the junction partner layer and is typically used as a transparent electrode. CIS-based solar cells have been demonstrated to have power conversion efficiencies exceeding 19%.

High throughput production methods are in development to manufacture this type of thin-film photovoltaic device. As improvements are made for high throughput production of the absorber layer in such thin-film devices, similar advances need to be made with regards the deposition or formation of the junction partner layer to prevent bottlenecking of the production process.

It should be understood, however, that the materials used for forming the junction partner can contain toxic material and difficulties are encountered in improving the manufacturing system. One process for forming the junction partner involves using Group II-VI compounds such as CdS. The CdS used in the formation process may create hazardous waste by-products, thus increasing processing costs. Known processes are also inefficient or unreliable in creating a system with high throughput and high yield. Some known systems either use too much starting material, much of which is wasted during production. Others use systems that may be susceptible to imperfections in the underlying substrate that may cause non-uniform deposition of the junction partner material over a wide web. Therefore, a need exists in the art for an improved junction partner deposition system.

SUMMARY OF THE INVENTION

Embodiments of the present invention address at least some of the drawbacks set forth above. The present invention provides for the improved deposition system for group IIB-VIA materials. Although not limited to the following, these improved module designs are well suited for roll-to-roll, in-line processing equipment. It should be understood that at least some embodiments of the present invention may be applicable to any type of solar cell, whether they are rigid or flexible in nature or the type of material used in the absorber layer. Embodiments of the present invention may be adaptable for roll-to-roll and/or batch manufacturing processes. At least some of these and other objectives described herein will be met by various embodiments of the present invention.

In one embodiment of the present invention, a deposition system is provided for use with a solution and a substrate. The system comprises of a solution deposition apparatus; at least one heating chamber; at least one assembly for holding a solution over the substrate; and a substrate curling apparatus for curling at least one edge of the substrate to define a zone capable of containing a volume of the solution over the substrate.

In another embodiment of the present invention, a deposition system for use with a substrate, the system comprising a solution deposition apparatus; at heating chamber; and at least assembly for holding solution over the substrate to allow for a depth of at least about 0.5 microns to 10 mm.

In yet another embodiment of the present invention, a deposition system is provided for use with a solution and a substrate. The system comprises of a solution deposition apparatus; at least one heating chamber; at least one assembly for holding a solution over the substrate; and a substrate curling apparatus for curling at least one edge of the substrate to define a zone capable of containing a volume of the solution over the substrate.

It should be understood that any of the embodiments herein may be adapted to have one or more of the following features. In one embodiment, the assembly curls at least two edges of the substrate. Optionally, the assembly for holding solution over the substrate to allow for a depth of at least about 0.5 microns to about 10 mm. Optionally, the assembly for holding solution over the substrate to allow for a depth of at least about 1 mm to about 5 mm. Optionally, the curling apparatus curls opposing edges of the substrate. Optionally, the curling apparatus is configured to transition a planar substrate to a substrate with curls along two edges, wherein the transition occurs over a distance sufficient prevent permanent deformation of the substrate when the substrate is uncurled. Optionally, the curling apparatus is configured to transition a planar substrate to a substrate with curls along two edges over a distance of at least 4 inches. Optionally, the curling apparatus is configured to transition a planar substrate to a substrate with curls along two edges over a distance of at least 6 inches. Optionally, the curling apparatus creates curls of sufficient height to contain the volume of solution therein without allowing the solution to spill over an upper of the curl. Optionally, the assembly for holding solution further comprises of an uncurling apparatus for uncurling at least two edges of the substrate to return the substrate to a substantially planar configuration. Optionally, the curling apparatus comprise of a web guide. Optionally, the curling apparatus comprise of a shaped web guide. Optionally, the solution deposition apparatus comprises of a spray deposition system to deposit the solution over the substrate. Optionally, the solution deposition apparatus comprises of an ultrasonic spray deposition system to deposit the solution over the substrate. Optionally, the substrate comprises of a flexible material. Optionally, the substrate comprises of a metal foil. Optionally, the solution comprises a precursor for forming a junction partner for a group IB-IIIA-VIA absorber layer. Optionally, the solution comprises a precursor for forming a Group IIB-VIA junction partner. Optionally, the solution comprises a precursor for forming a junction partner selected from the group consisting of: cadmium sulfide (CdS), zinc sulfide (ZnS), zinc hydroxide, zinc selenide (ZnSe). Optionally, the solution comprises of a Group IIB ionic species is obtained from an aqueous solution of one or more of the following: sulfate, acetate, bromide, fluoride, chloride, iodide, hydroxide, nitrate, oxalate, citrate, phosphate, tungstate, or hydrates of the Group IIB species. Optionally, the solution comprises of a Group VIA ionic species is obtained from an aqueous solution of one or more of the following: oxides, halides, sulfates, nitrates, or ureates of the Group VIA species. Optionally, the solution has a pH of from about 9 to about 14. Optionally, the solution has a pH of from about 11 to about 12. Optionally, the assembly for holding solution is at least partially contained in the heating chamber.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a roller optionally contains a feature for a thermally conductive film, this means that the conductive film feature may or may not be present, and, thus, the description includes both structures wherein a roller possesses the conductive film feature and structures wherein the film feature is not present.

Photovoltaic Device Structure

Figure 1:
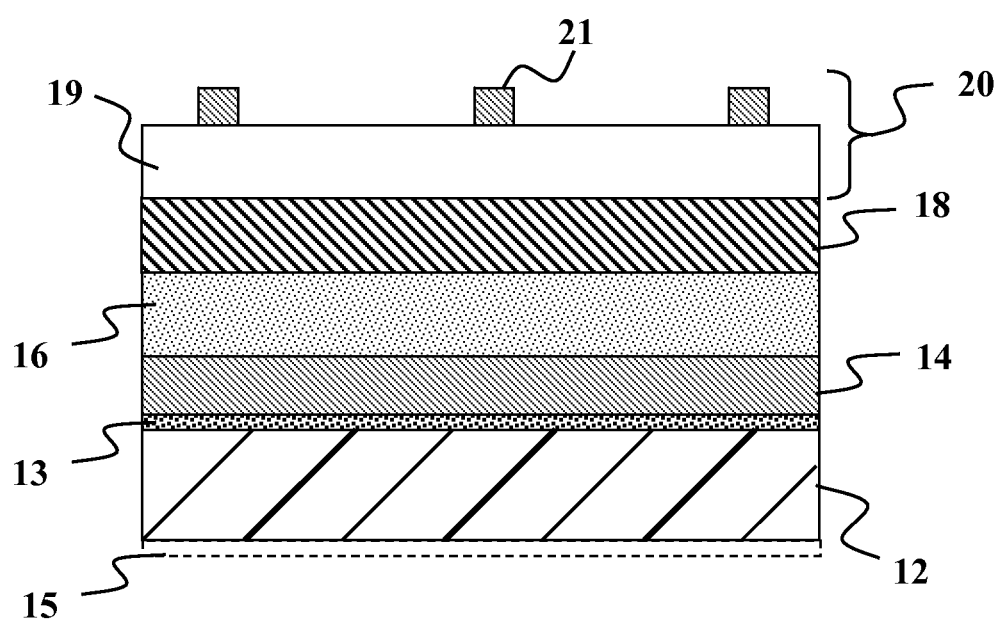
FIG. 1 is a cross-sectional view of a photovoltaic device according to one embodiment of the present invention.

Referring now to FIG. 1, one embodiment of such a photovoltaic device 10 will now be described. Although the present embodiment is described in the context of a thin-film group IB-IIIA-VIA device, it should be understood that other types of photovoltaic devices may also be produced using the junction partner formation techniques described herein.

As seen in FIG. 1, the structure of a photovoltaic device 10 according to the present invention includes a base substrate 12, an optional intermediate layer 13, a base or back electrode 14, a p-type absorber layer 16 incorporating a film of the type described above, a n-type junction partner semiconductor thin film 18, and a transparent electrode 20. By way of example, the base substrate 12 may be made of a metal foil, a polymer such as polyimides (PI), polyamides, polyetheretherketone (PEEK), Polyethersulfone (PES), polyetherimide (PEI), polyethylene naphtalate (PEN), Polyester (PET), related polymers, or a metallized plastic. By way of nonlimiting example, related polymers include those with similar structural and/or functional properties and/or material attributes. The base electrode 14 is made of an electrically conductive material. By way of example, the base electrode 14 may be of a metal layer whose thickness may be selected from the range of about 0.1 micron to about 25 microns. An optional intermediate layer 13 may be incorporated between the electrode 14 and the substrate 12. The transparent electrode 20 may include a transparent conductive layer 19 and a layer of metal (e.g., Al, Ag, Cu, or Ni) fingers 21 to reduce sheet resistance.

In one embodiment, the base substrate 12 may be a metal foil made of a material such as but not limited to stainless steel, copper, aluminum, nickel, molybdenum, or the like. In one embodiment, aluminum is used with a molybdenum base electrode. Aluminum and molybdenum, however, can and often do inter-diffuse into one another, especially upon heating to elevated temperatures as used for absorber growth, with deleterious electronic and/or optoelectronic effects on the device 10. Furthermore aluminum can diffuse though molybdenum into layers beyond e.g. CIG(S). To inhibit such interdiffusion, an intermediate, interfacial layer 13 may be incorporated between the aluminum foil substrate 12 and molybdenum base electrode 14. The interfacial layer may be composed of any of a variety of materials, including but not limited to chromium, vanadium, tungsten, and glass, or compounds such as nitrides (including but not limited to titanium nitride, tantalum nitride, tungsten nitride, hafnium nitride, niobium nitride, zirconium nitride, vanadium nitride, silicon nitride, or molybdenum nitride), oxynitrides (including but not limited to oxynitrides of Ti, Ta, V, W, Si, Zr, Nb, Hf, or Mo), oxides, and/or carbides. The material may be selected to be an electrically conductive material. In one embodiment, the materials selected from the aforementioned may be those that are electrically conductive diffusion barriers. The thickness of this layer can range from 10 nm to 50 nm or from 10 nm to 30 nm. Optionally, the thickness may be in the range of about 50 nm to about 1000 nm. Optionally, the thickness may be in the range of about 100 nm to about 750 nm. Optionally, the thickness may be in the range of about 100 nm to about 500 nm. Optionally, the thickness may be in the range of about 110 nm to about 300 nm. In one embodiment, the thickness of the layer 13 is at least 100 nm or more. In another embodiment, the thickness of the layer 13 is at least 150 nm or more. In one embodiment, the thickness of the layer 13 is at least 200 nm or more. Optionally, some embodiments may include another layer such as but not limited to a copper layer, a titanium layer, or other metal layer above the layer 13 and below the base electrode layer 14. Optionally, some embodiments may include another layer such as but not limited to a copper layer, a titanium layer, an aluminum layer, or other metal layer below the layer 13 and below the base electrode layer 14. This layer may be thicker than the layer 13. Optionally, it may be the same thickness or thinner than the layer 13. This layer 13 may be placed on one or optionally both sides of the aluminum foil (shown as layer 15 in phantom in FIG. 5). Some embodiments may use an electrically conductive barrier on side and a non-electrically conductive barrier on the other side. Other embodiments use the same type of conductivity material on both sides.

If barrier layers are on both sides of the substrate 12, it should be understood that the protective layers may be of the same material or they may optionally be different materials from the aforementioned materials. The bottom protective layer 105 may be any of the materials. Optionally, some embodiments may include another layer 107 such as but not limited to an aluminum layer above the layer 105 and below the aluminum foil 102. This layer 107 may be thicker than the layer 103

In the present embodiment, the structure of the photovoltaic device 10 may include a semiconductor thin film 18 of a complementary charge type that serves as a junction partner between the compound film and the transparent conducting layer 19. By way of example, the n-type semiconductor thin film 18 (sometimes referred to as a junction partner layer) may include inorganic materials such as cadmium sulfide (CdS), zinc sulfide (ZnS), zinc hydroxide, zinc selenide (ZnSe), n-type organic materials, or some combination of two or more of these or similar materials, or organic materials such as n-type polymers and/or small molecules. Other types of junction partner material such as poly(benzimidazobenzophenanthroline ladder) (BBL) may also be used as a junction partner material according to the present invention. Details about BBL is provided in copending U.S. patent application Ser. No. 11/409,503 filed Apr. 21, 2006, fully incorporated herein by reference for all purposes. Layers of these materials may be deposited, e.g., by chemical bath deposition (CBD) and/or chemical surface deposition (and/or related methods), to a thickness ranging from about 2 nm to about 1000 nm, more optionally from about 5 nm to about 500 nm, and most optionally from about 10 nm to about 300 nm. In some embodiments, the thickness may be in the range of about 10 to about 100 nm. In other embodiments, the thickness may be in the range of about 15 to about 80 nm. This may also configured for use in a continuous roll-to-roll and/or segmented roll-to-roll and/or a batch mode system.

The transparent conductive layer 19 may be inorganic, e.g., a transparent conductive oxide (TCO) such as but not limited to indium tin oxide (ITO), fluorinated indium tin oxide, zinc oxide (ZnO) or zinc oxide ($ZnO_x$) doped with aluminum, or a related material, which can be deposited using any of a variety of means including but not limited to sputtering, evaporation, chemical bath deposition (CBD, electroplating, sol-gel based coating, spray coating, chemical vapor deposition (CVD), physical vapor deposition (PVD), atomic layer deposition (ALD), and the like. Alternatively, the transparent conductive layer may include a transparent conductive polymeric layer, e.g. a transparent layer of doped PEDOT (Poly-3,4-Ethylenedioxythiophene), carbon nanotubes or related structures, or other transparent organic materials, either singly or in combination, which can be deposited using spin, dip, or spray coating, and the like or using any of various vapor deposition techniques. Optionally, it should be understood that a nonconductive layer such as intrinsic ZnO (i-ZnO) may be used between CdS and Al-doped ZnO. Optionally, an insulating layer may be included between the layer 18 and transparent conductive layer 19. Combinations of inorganic and organic materials can also be used to form a hybrid transparent conductive layer. Thus, the layer 19 may optionally be an organic (polymeric or a mixed polymeric-molecular) or a hybrid (organic-inorganic) material. Examples of such a transparent conductive layer are described e.g., in commonly-assigned US Patent Application Publication Number 20040187317, which is incorporated herein by reference.

Those of skill in the art will be able to devise variations on the above embodiments that are within the scope of these teachings. For example, it is noted that in embodiments of the present invention, portions of the IB-IIIA precursor layers (or certain sub-layers of the precursor layers or other layers in the stack) may be deposited using techniques other than microflake-based inks. For example precursor layers or constituent sub-layers may be deposited using any of a variety of alternative deposition techniques including but not limited to solution-deposition of spherical nanopowder-based inks, vapor deposition techniques such as ALD, evaporation, sputtering, CVD, PVD, electroplating and the like.

Junction Partner Deposition System

Figure 2:
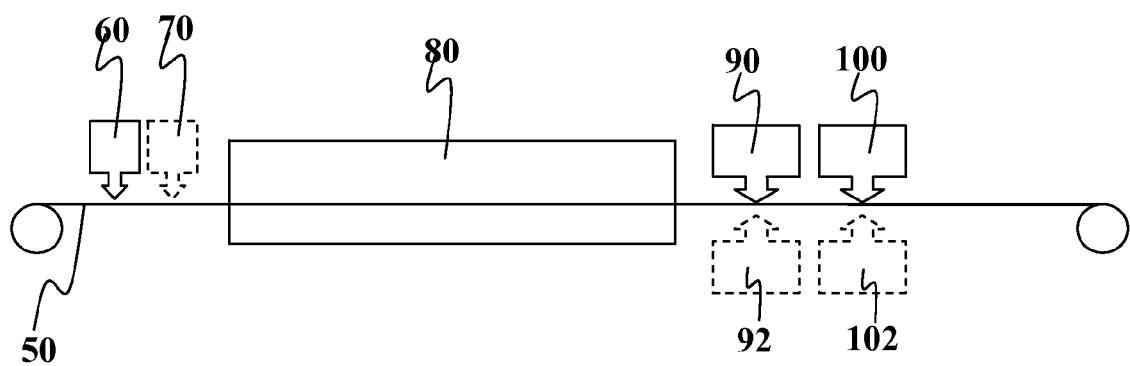
FIG. 2 shows a processing system according to one embodiment of the present invention.

Referring now to FIG. 2, one embodiment of a junction partner deposition system will now be described. In this embodiment of the invention, the deposition system may be a solution deposition system that occurs in an environment at atmospheric pressures. Optionally, it should be understood that the deposition system may also be used with vacuum, low vacuum, and/or sub-atmospheric pressures. Some embodiments may also use environments at pressures higher than atmospheric pressure.

FIG. 2 shows a system with a substrate 50 configured for use in an in-line, roll-to-roll configuration. The substrate 50 may be a coated metal, coated polymer, coated metallized polymer substrate, or any other substrate previous described herein. The coating may be a photovoltaic absorber layer such as but not limited to Cu—In—Ga—Se, Cu—In—Se, Cu—In—Ga—S, Cu—In—Ga—Se—S, other group IB-IIIA-VIA absorbers, CdTe, sulfo-salt, group IIB-VIA absorber, or other photovoltaic absorbers that use a junction partner layer. The photovoltaic absorber layer or other coating formed on the substrate 50 may be formed from one or more precursors deposited by any of a variety methods including but not limited to sputtering, electrodeposition, electroplating, solution deposition, ALD, evaporation, CVD, PVD, and/or the like. When the term substrate 50 is discussed herein, it may be a bare substrate or it may be the substrate with the coating thereon. By way of nonlimiting example, these absorber layers may also be formed on rigid substrates or flexible substrates.

In one embodiment, the substrate 50 is a flexible elongate substrate such as but not limited to an absorber coated metal foil. In another embodiment, the substrate 50 is a multi-layered flexible substrate such as that shown in FIG. 1. Optionally, there may be a carrier on which discrete or pre-cut substrates comprising the precursor layers may be placed. The carrier may then carry these discrete or pre-cut substrates through the processing station(s). As part of the initial setup, the surface of the substrate to be processed may be cleaned prior to solution deposition.

By way of example and not limitation, the junction partner used with the substrate 50 may be a Group IIB-VIA material. In one embodiment, the Group IIB ionic species may be comprised of one or more of the following: cadmium, mercury, zinc, cadmium, mercury or zinc which may be provided by one or more solutions of the following: sulfate, acetate, bromide, fluoride, chloride, iodide, hydroxide, nitrate, oxalate, citrate, phosphate, tungstate, hydrates or combinations thereof. The Group VIA ionic species comprises oxygen, sulfur, selenium, tellurium, polonium, or combinations thereof. The Group VIA ionic species is optionally obtained from an aqueous solution of oxides, halides, sulfates, nitrates, or ureates of the Group VIA species. The liquid coating composition optionally further comprises a solvent such as water, optionally deionized water. The liquid coating composition optionally has a pH of from about 9 to about 14, more optionally from about 10 to about 13 and most optionally from about 11 to about 12.

In one embodiment, a CdS layer is formed on substrate 50 by a solution deposition process. More specifically, in this embodiment, a solution containing cadmium acetate (Cd(CH$_3$COO)$_2$), thiourea (NH$_2$CSNH$_2$), ammonium acetate (CH$_3$COONH$_4$) and ammonia is prepared. In this present embodiment, the concentration of the cadmium acetate in the solution was 0.01M, the concentration of the thiourea was 0.005M, the concentration of the ammonium acetate was 0.01M and the concentration of the ammonia was 0.4M. The substrate coated in this solution to form a CdS layer on the substrate. This is purely exemplary and is non-limiting.

A variety of solution-based coating techniques may be used to apply the above liquids including but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, ultrasonic spray deposition, and the like, as well as combinations of the above and/or related technologies. The surface of the substrate 50 can be modified by the addition of a wetting agent to the solution, such as but not limited to glycerine. The liquid may also be a dispersion or ink containing the aforementioned materials. Depending on such surface tension, application of the liquid onto the substrate may optionally be conducted upside down.

Referring still to FIG. 2, this embodiment shows that a spray technique is used to apply the liquid coating to the substrate 50. In this embodiment, the solution may be a mixture of 0.005-0.01M CdSO4 solution with 2M of NH4OH to pH of about 12. Optionally, the solution may be a mixture of cadmium sulfate is between about 0.001 to about 0.008 mole/liter. Optionally, the solution may be a mixture of cadmium sulfate is between about 0.002 to about 0.005 mole/liter. Optionally, a 0.3-0.5M thiourea solution is included. Optionally, the thiourea concentration is between 0.1-0.6 mole/liter. Optionally, the thiourea concentration is between 0.2-0.5 mole/liter. FIG. 2 shows that this embodiment uses a spraying assembly 60 configured to spray material onto the substrate 50. By way of example and not limitation, the spray assembly 60 may use a single nozzle, two nozzles, or multiple nozzles to spray liquid across the width of the substrate 50. One or more of the nozzles may be ultrasonic nozzles. Ultrasonic nozzles are commercially available from manufacturers such as J D Ultrasonics of the United Kingdom. Optionally, the nozzles may be dual jet nozzles that are configured for atomizing liquid across a wide web such as that available from Wilson Spray Nozzle of Singapore. There may be one or more these wide web nozzles in assembly 60. Optionally, one or more of the nozzles may be a vortex nozzle, wherein the flow from the nozzle is such that a vortexing flow exits the nozzle to define a cone-shaped spray. Optionally, wide web and vortex nozzles may be used in combination. The spray assembly 60 may be sufficient to spray across a substrate 50 that may have a width of greater than 0.5 meters. Optionally, the spray assembly 60 may be sufficient to spray across a substrate 50 that may have a width of greater than 1.0 meters. Optionally, the spray assembly 60 may be sufficient to spray across a substrate 50 that may have a width of greater than 2.0 meters. Optionally, the spray assembly 60 may be sufficient to spray across a substrate 50 that may have a width of greater than 3.0 meters.

It should also be understood that the temperature of the solution or dispersion being deposited and/or that of the substrate may also be controlled. In one embodiment, the container containing this solution was put in a hot water bath kept at about 85 .degree. C prior to deposition and is deposited on a substrate at a lower temperature. In some embodiments, the substrate is at ambient temperature, or heated but to a temperature less than or equal to the temperature of the solution or dispersion to be deposited. Optionally, both the solution and the substrate 50 are at substantially the same temperature. In one embodiment, neither the solution or the substrate 50 are heated and both are at ambient temperatures. In other embodiments, the substrate 50 may be heated from ambient to about 60 to about 90° C. In other embodiments, the substrate 50 may be heated from ambient to about 50 to about 90° C. In other embodiments, the substrate 50 may be heated from ambient to about 40 to about 10° C. In other embodiments, the solution or dispersion may actually be chilled or cooled to be below ambient temperature.

In another aspect, the amount of solution applied may be either a thin layer or it may be sufficient to create a bath of a depth of about 0.5 mm to about 5 mm in depth. Optionally, the bath may be about 0.5 microns to about 10 mm in depth. A shallow bath allows for sufficient coverage of the entire target surface of the substrate 50 while not substantially under-utilizing the raw material. The bath above the substrate 50 may be contained above the substrate 50 against a slidable seal and/or a movable seal. Optionally, the substrate 50 passes through a bath of the solution, wherein the substrate 50 may have a backside layer that can be removed.

Referring still to FIG. 2, a second deposition assembly 70 (shown in phantom) may also be used. This may be the same type of ultrasonic nozzle used in the solution deposition assembly 60. Optionally, it may one of the other types of deposition system such as but not limited to a vortex, wide-web, or other nozzle type different from the nozzle used in the solution deposition assembly 60. Optionally, the second deposition assembly 70 may include one or more of the following: wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, and the like, as well as combinations of the above and/or related technologies. The solution from assembly 70 may be the same as that from assembly 60 or it may be a component used in the process such as the thiourea solution or the like.

It should be understood that in some embodiments, there may be more than two deposition sources 60 and 70. Some embodiments may have three or more. Each may be depositing just one component of the material in the processing solution. Some may be depositing mixtures. Some embodiments may use a combination (some sources depositing just one component, while another source depositions mixtures of one or more). It should also be understood that in some embodiments, the solutions, components, or other material from deposition sources 60 and 70 may all be at temperatures higher than that of the substrate, the same as the temperature of the substrate, or at temperatures lower than that of the substrate. Optionally, only one of the deposition sources is depositing at temperatures higher than that of the substrate. Optionally, only one of the deposition sources is depositing at temperatures the same as that of the substrate. Optionally, only one of the deposition sources is depositing at temperatures lower than that of the substrate. The sequence may also be varied such as but not limited to a cadmium salt solution first and then thiourea or other S solution later. Some embodiments may add one or more other complexing agents. The sequence may be varied with the S solution deposited first and then followed by the cadmium salt solution and any other components. Some may involve a combination of wet deposition and dry deposition processes such as a liquid S solution with cadmium salt nanoparticles added at a different station. Of course, the type of deposition may also be varied such as but not limited to slot die deposition followed by a predefined time delay of a spray deposition of another component or vice versa. Any of the multi-deposition source systems may be adapted for use with any of the embodiment of the processing system described herein.

As seen in FIG. 2, after solution deposition by assembly 60 and/or 70, the substrate 50 enters an oven 80 for heating the solution to enable film growth or formation. In one embodiment, the oven 80 is used to heat the substrate to between about 65 to about 90 C. Optionally, some embodiments, may heat to higher temperatures such as about 90 to about 130 C. A variety of ovens may work. In one embodiment, the oven 80 comprises of an infrared oven is used to heat the substrate 50 and the solution over the substrate 50. Infrared ovens are available from a variety of manufacturers including Glenro Inc. of Paterson, N.J. Other embodiments may use muffles wherein the heating elements are located outside the tube furnace or muffle through which the substrate passes. The heating elements heat the muffle, which in turn heats the substrate. Some embodiments may only include heating element on one side of the oven 80 (e.g. top) or only on the other side (e.g. bottom). In one embodiment, the group IIB-VIA material over the substrate 50 may have a cured thickness of about 20 to about 100 nanometers. Optionally, the thickness may be between about 100 to about 150 nanometers.

After passing through the oven 80, the substrate 50 reaches a cleaning station 90. This cleaning system 90 may use a pressure spray of liquid such as but not limited to deionized water to remove unused or uncured solution applied to the substrate 50. The wash off from the pressure spray is collected and the waste liquid contained or processed for proper removal.

Optionally, a second cleaning station 100 is included. This may be an additional washing station similar to the cleaning station 90, it may be an air knife or other source to dry the substrate 50, or it may be cleaning system using some other type of cleaning solution. The cleaning and/or drying may occur on only one side of the substrate 50 or it may be from the underside or other directions as indicted by stations 92 and 102 in phantom. Optionally, it may be a combined heating and air dry station to remove un-wanted material from the surface of the substrate and to prepare the substrate for the next stage of processing. In some embodiments, the heating may occur after the air drying and may use an infrared heating to increase the substrate temperature and to prepare it for the next layer to be deposited on the photovoltaic device. In one embodiment, the substrate 50 after the various processes above, is heated to about 10° C. or higher at 2 meters per minute to dry the web or substrate 50 and to prepare it for the next layer.

Figure 3:
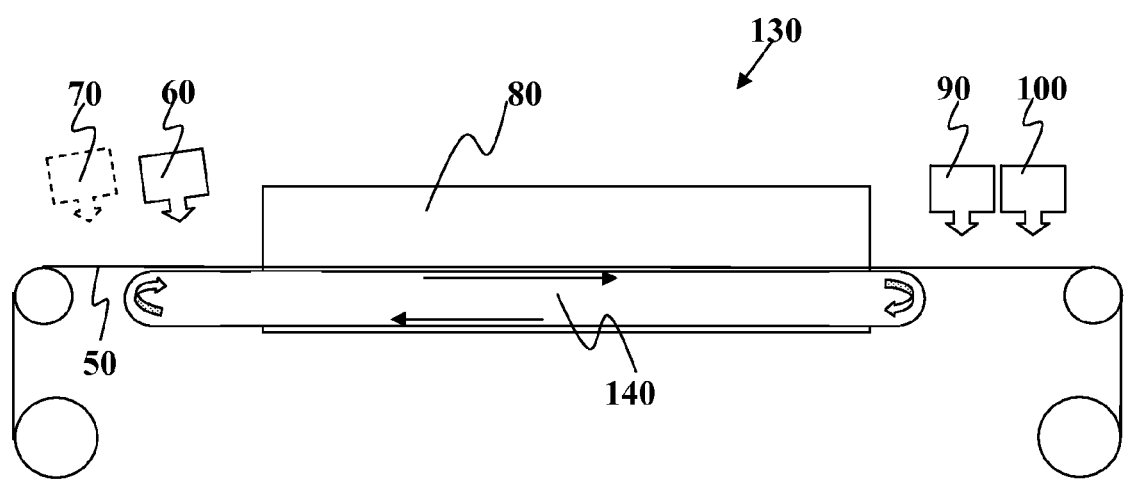
FIG. 3 shows a processing system according to another embodiment of the present invention.

Referring now to FIG. 3, another embodiment of the present invention will now be described. This embodiment shows a junction partner deposition system 130 with a solution deposition by assembly 60 and/or 70. The oven 80 is used to heat the solution deposited on the substrate 50 to from the assembly 60 and/or 70. This embodiment of the junction partner deposition system includes a vacuum pull belt system 140 which will help flatten the substrate 50 during the processing. This is particularly helpful as some wider flexible substrates 50 after deposition of semiconductor or other absorber material will curl and assume non-planar configurations without force or substrate guides to help flatten the substrate 50. Vacuum pull belt systems are available from manufacturers such as Kliklok-Woodman of Decatur Ga. Some systems may use an articulated floating vacuum pull belt arrangement as described in U.S. Pat. No. 5,715,656 and fully incorporated herein by reference for all purposes.

In this embodiment, the vacuum pull belt system 140 extends outside the oven 80. Optionally, in other embodiments, the vacuum pull belt system 140 may extend only within the boundaries of the oven 80. As seen in FIG. 3, the spray of the solution may occur over the system 140 by way of the spray assembly 60 or it may occur at a location of the substrate 50 spaced away from the belt system 140 as indicated by a spray assembly located at position 70.

Figure 4:
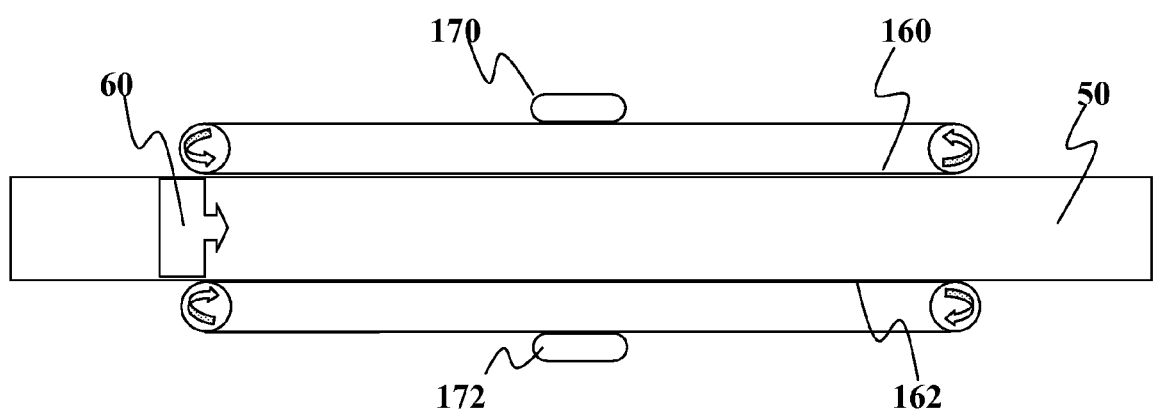
FIG. 4 shows top down view of a processing system according to another embodiment of the present invention.

FIG. 4 shows yet another embodiment wherein a moving seal systems 160 and 162 which may be alongside the areas where the solution is deposited on the substrate 50. FIG. 4 is a top down view of the substrate 50 and the seals of the systems 160 and 162 will form sidewalls against the substrate 50 that allows the bath to be formed over the substrate 50. In one embodiment, the seals of the systems 160 and 162 will also keep the bath or layer of solution on only one side of the substrate 50. The systems 160 and 162 may also be configured to have seals that move with the substrate 50. Other embodiments may have stationary seals that allow the substrate to slide along against it. Some embodiments may also include a dip in the substrate path (see FIG. 33) to help prevent the fluid or solution from flowing too far downweb or upweb. Scrubbing units 170 and 172 may also be included to clean the surface of the seal to remove and undesired build up that may prevent a good seal against the substrate 50. Other embodiments may use the units 170 and 172 to apply sealant to help the seal against the substrate 50.

Still further embodiments may use two back-to-back substrates 50 to allow for higher utilization. To avoid waste or undesired processing, two substrates may be attached together "back-to-back" to form a dual substrate having, in effect, two front sides with the back sides protected against undesired treatment. Preferably, the substrates are attached in a manner that allows them to be separated from each other after processing. By way of example the substrates may be attached with a low-strength adhesive or electrostatic film applied to the back side of one or both substrates. Alternatively, an edge where the two substrates join may be sealed, e.g., with a tape, so that reactants cannot reach the back sides during processing. The dual substrate may then be wound into a coil and coated such that both front surfaces are treated while the back surfaces are not. Processing the substrate in this fashion may reduce the waste of reactants and may increase the area of the substrate that can be processed at one time. Optionally, other embodiments may use a sacrificial backside that is removed after processing to reveal a backside that is not processed. These systems are particularly suited for a bath-type system wherein the substrate is passed through a solution that exposes both sides of the substrate.

Figure 5:
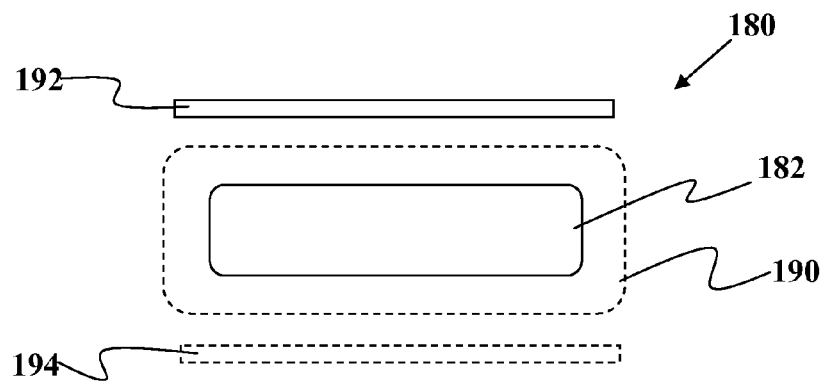
FIG. 5 shows cross-sectional view of a processing system according to one embodiment of the present invention.

Referring now to FIG. 5, it should be understood that the environment inside the oven may be different from the ambient atmosphere. Although some embodiments may used an ambient air environment inside the oven 180, other embodiments may use non-air atmospheres. By way of example and non-limiting example, the atmosphere in the muffle 182 may be comprised of ammonia or ammonia based material to prevent loss of ammonia or similar material from the solution. The loss of material may create a change in pH that changes the reaction dynamics. Other embodiments may use other atmospheres that create an overpressure of the material that may be volatile and escape from the solution during processing. The material in the gas environment of muffle 182 is based on what type of reaction is occurring and what materials may be vaporized or lost during processing.

By way of example and not limitation, the muffle 182 may be designed with openings sized to handle foils of wide widths. In one nonlimiting example, the substrate 50 may be at least 1 meter in width. In another embodiment, the substrate 50 may be at least 2 meters in width. In another embodiment, the substrate 50 may be at least 3 meter in width.

In one embodiment, the openings in muffle 182 are sized so as to provide minimal clearance above the substrate to reduce the amount of gas escaping. In one embodiment, the interior height of the muffle is less than about 3 inches. In one embodiment, the interior height of the muffle is less than about 2 inches. In one embodiment, the interior height of the muffle is less than about 1 inch. In one embodiment, the interior height of the muffle is less than about 0.5 inches. Although not limited to the following, the ratio of the interior width to the interior height at the narrow points in the chamber or muffle may be at least about 10:1. Although not limited to the following, the ratio of the interior width to the interior height at the narrow points in the chamber or muffle may be greater than about 10:1. Optionally in other embodiments of the invention, the ratio of the interior width to the interior height at the narrow points in the chamber or muffle may be greater than about 14:1. Although a muffle is used in this example, it should be understood that other designs using a cover over a U cross-sectional shaped web guide may also be sufficient to create the desired covered tunnel environment. In one embodiment, the height of the head space above the substrate is predetermined based on the processing gas and/or fluid used in that particular zone or area of the processing system.

In some embodiments herein, the muffle 182 may be multi-zoned with separate chambers in the muffle. These zones may be integrated into one structure or they may be separated detached structures each defining at least one zone. The zones may be separated from each other by a small gap, or alternately all zones may structurally be connected to each other, however they may be internally separated through use of seals or spacers.

FIG. 5 also shows in phantom that a second muffle 190 may be used around the inner muffler 182. The atmosphere in outer muffle 190 may be the same as that in the inner muffle 182. Optionally, the muffle 190 has an atmosphere different from that in the muffle 182. In one embodiment, the muffle 190 includes an inert atmosphere such as but not limited to nitrogen, argon, or the like. The muffle 190 may be the same length as the muffle 182. Optionally, the muffle 190 may be longer than the inner muffle 182 to prevent escape of gas into the outside environment. It would instead escape into the outer muffle 190. Optionally, each muffle may be inert gas zones near the inlet and outlet of each muffle to help prevent escape of the interior processing gas. FIG. 5 also shows how heater elements 192 and 194 may be located outside, above and/or below the muffle.

Figure 6:
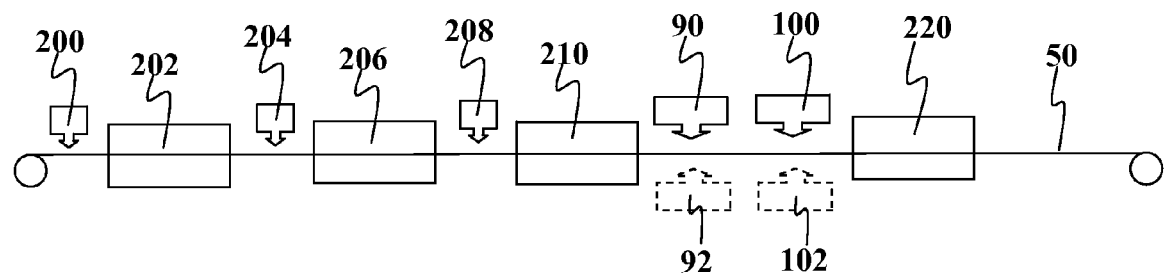
FIG. 6 shows a processing system according to another embodiment of the present invention.

Referring now to FIG. 6, yet another embodiment of the present invention is shown wherein multiple spray and heating locations are shown. In this embodiment, a spray section 200 is used to deposit the solution, followed by an oven section 202 to heat the liquid. This system may be followed by spray section 204, oven 206, spray section 208, and oven 210. The spray and oven sections may be repeated as desired to create the layer on the substrate 50 of the desired thickness. In this embodiment, each spray and oven section creates about 25 to about 35 nanometer thickness of the junction partner. Other embodiments may use deposition sections that create thicker or thinner layers. Some may also use sections to deposit different materials or different components used for the junction partner. Still other embodiments may use ovens that run at different temperatures. Some may have heat in about 70 to about 90 C. Optionally, others may heat higher to about 40 to about 90 C. Optionally, others may heat higher to about 90 to about 130 C. Optionally, others may use lower temperatures of about 55 to about 75 C. The ovens may be arranged to go high heat to low heat. Optionally, they may go from low heat to high heat. Others may use a heat profile with high heat in the middle oven, but lower heat at the beginning or end ovens. This heating may be followed up by wash and dry units 90 and 100. An oven 220 may be included to further dry the substrate and/or prepare it for the next layer of processing. Some embodiment may roll directly to the next deposition section which may be a TCO sputtering or other deposition device. The substrate 50 may also come directly from CIGS or other absorber layer deposition and processing in a complete roll-to-roll process. It should also be understood that in alternative embodiments, there may be an alternative embodiment with a delayed processing, e.g. not direct and not step repeat. In these alternative embodiments, there may be non-continuous processing of the substrate.

Figure 7:
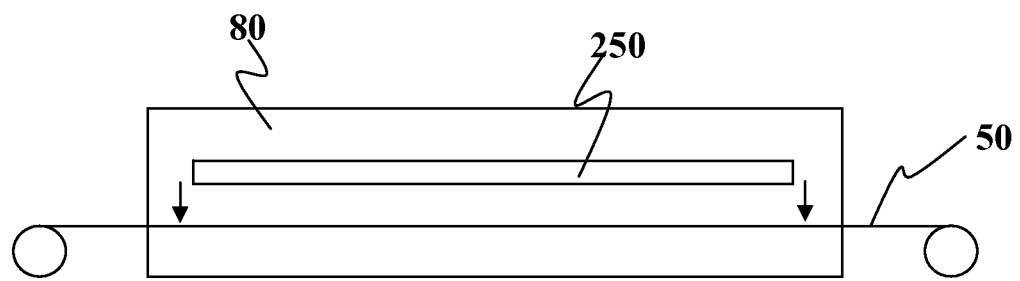
FIG. 7 shows a processing system according to another embodiment of the present invention.

Referring now to FIG. 7, a still further embodiment of the present invention will now be described. This embodiment uses a frame 250 that is raised and lowered over the substrate 50. In a step-repeat function, the substrate 50 may be advanced to place an unprocessed portion below the frame 250. The frame 250 is lowered to contact the substrate 50 or close enough to prevent significant loss (more than 10%) of the fluid over the substrate during processing. Again, any solution deposition may be used. A variety of solution-based coating techniques may be used to apply the liquid including but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, ultrasonic spray deposition, and the like, as well as combinations of the above and/or related technologies. The surface of the substrate 50 can be modified by the addition of a wetting agent to the solution, such as glycerine. The liquid may also be a dispersion or ink containing the aforementioned materials. Depending on such surface tension, application of the liquid onto the substrate may optionally be conducted upside down.

The oven 80 is heated during, before, or after deposition of fluid into the frame 250. After processing and heating, the frame 250 is raised and the substrate 50 is advanced to place a new, untreated section below the frame 250. Again, the oven 80 may have an ammonia or other atmosphere as described above. The frame 250 may be filled multiple times over one section of the substrate 50 to build up the desired amount of thickness. Other embodiments may use a frame 250 that moves with the substrate to allow for a moving process where the substrate is not complete stopped. The frame 250 may be lowered down over an area of the substrate while it is outside the oven 80.

Figure 8:
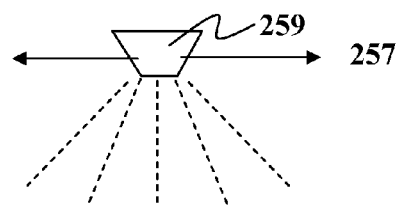
FIG. 8 shows a cross-sectional view showing deposition of material embodiment of the present invention.
Figure 8:
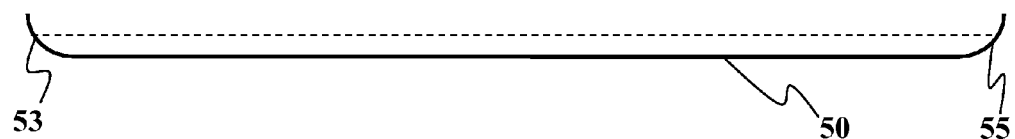

Referring now to FIG. 8, yet another embodiment of the present invention will now be described. This embodiment shows that instead of using seals, frames or other elements to help contain a fluid over the substrate 50, the edges 53 and 55 of a flexible substrate 50 may be curved, curled, or angled upward. This defines a cupped or bowl-type cross-sectional shape that allows fluid to be filled therebetween as indicated by line 57 shown in phantom. The depth of the fluid between the upwardly curled edges 53 and 55 may be filled to a level below the upper edges, below the upper edges, and/or optionally over the upper edges. By way of example and not limitation, the depth of fluid over the substrate 50 may be in range from about 0.1 mm to about 20 mm. Optionally, in another embodiment, the depth of fluid over the substrate 50 may be in range from about 0.5 mm to about 10 mm. In the present embodiment, a fluid deposition assembly 259 may be used to form a covering of fluid over the substrate 50. Optionally, the assembly 259 and any other of the deposition systems such as but not limited to drip, spray, or other fluid coating devices may be mounted to move in manner such as but noted limited to that as indicated by arrows 257 to improve coverage of the fluid deposition over substrate 50. Optionally, this may be achieved by mechanical motion laterally and/or by angulation of deposition nozzle, hose, or other deposition device/assembly.

It should be understood that the fluid may be deposited by any of a variety of solution deposition techniques including, but not limited to, wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, ultrasonic spray deposition, and the like, as well as combinations of the above and/or related technologies. FIG. 8 shows one embodiment wherein the fluid is sprayed onto the substrate 50. The fluid may being deposited may be at a temperature that is substantially the same as that of the substrate 50. Optionally, in other embodiments, the fluid may be cooler than the substrate 50 or hotter than the substrate 50. Some embodiments may heat the fluid so that it is warmer than the ambient temperature. Some embodiments may use an air knife to cool and/or clean the substrate prior to deposition of the fluid.

Figure 9:
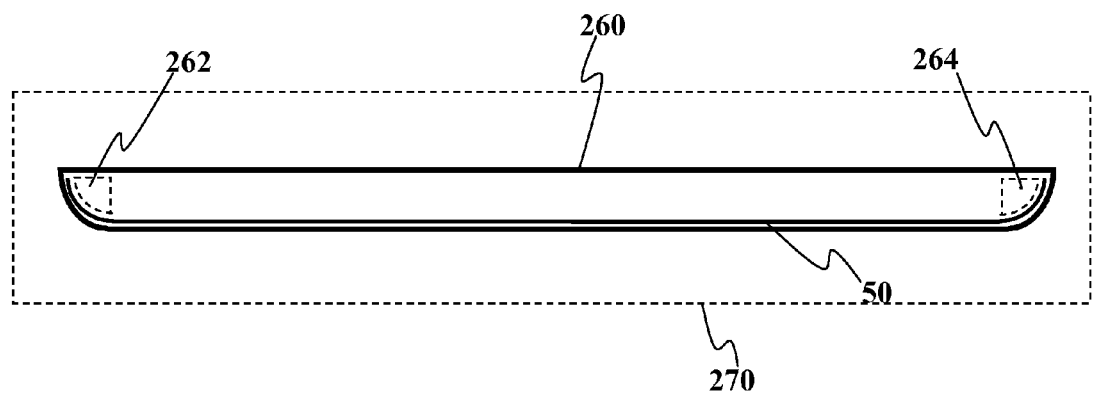
FIG. 9 shows a cross-sectional view of one embodiment of a processing system configured to curl one or more edges of a substrate.

FIG. 9 shows that in one embodiment, the substrate 50 with or without curls 53 and 55 may be moved into a closely spaced muffle, covered oven, or other structure to minimize the amount of open space above the substrate 50. These embodiments reduce the amount of evaporation of the fluid covering the substrate 50. In the current embodiment, the muffle 260 is used to define the covered oven through which the substrate 50 passes. The muffle 260 is shown to have curved wall surfaces to maintain the curved configuration of the substrate 50. Some embodiments may optionally have slots or grooves defined by guides 262 and 264 (shown in phantom).

FIG. 9 also shows that an optional external oven 270 may be used around the muffle 260. This embodiment allows for convective heating to be used outside the muffle 260 to heat the muffle 260, the substrate 50, and the fluid over the substrate 50. The oven 270 may be filled with the same atmosphere as that inside the muffle 260. Optionally, the muffle 260 may be filled with an inert gas such as but not limited to nitrogen, argon, other inert gas, or other gas suitable for use with the atmosphere in the muffle 260. The oven 270 may be the same length as muffle 260, shorter than muffle 260, or longer than muffle 260.

Figure 10:
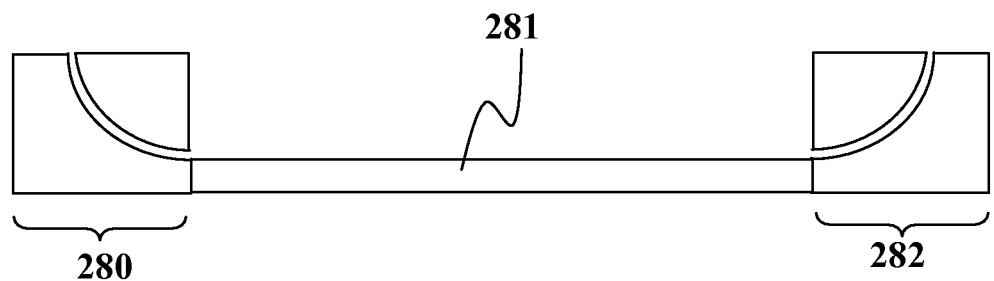
FIG. 10 through 11B show various mechanisms for use for curling one or more edges of a substrate.

Referring now to FIG. 10, a cross-section of a guide is shown for curling the substrate 50 to have the formed edges 53 and 55. This cross-section shows that substrate 50 may be transformed from a substantially planar configuration to one with a configuration sufficient to hold fluid therebetween. Again, guides 280 and 282 may be provided to help curl the substrate upward. The surface 281 may be a low friction surface such as but not limited to Teflon® or similar material. The surfaces of guides 280 and 282 may be similarly treated. Optionally, a low friction surface 281 may comprise of a covering, tiles, plates, or other overlayers that are placed on top of a surface that may have a higher coefficient or friction. Some embodiments may have a low friction surface along all portions of the substrate path wherein the backside of the substrate contacts or slides against any portion of the processing system.

Figure 11A:
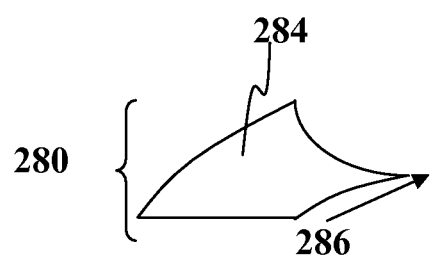

FIG. 11A shows that the surface 284 of guide 280 may be a gradually curving surface to transition the planar edge of the substrate to a curved configuration. By way of example and not limitation, the length of surface 284 as indicated by arrow 286 may be in the range from about 1 inch to about 10 inches. The greater length eases the transition from planar configuration to curved configuration. Optionally, the transition length may be in the range of about 2 to about 6 inches. Optionally, the transition length may be a percentage based on the width of the web. In one embodiment it may be between 10% to 120% of the width of the web. Optionally, in another embodiment, the transition length is selected to be between 25% to 75% of the width of the web or substrate. Optionally, some embodiments also factor the height of the bent portion into the amount of length desired for the transition. In one embodiment, the length for transition is about 8× to 24× the height of the desired bend. Optionally, the transition length is about 4× to 40× the height of the desired bend.

Figure 11B:
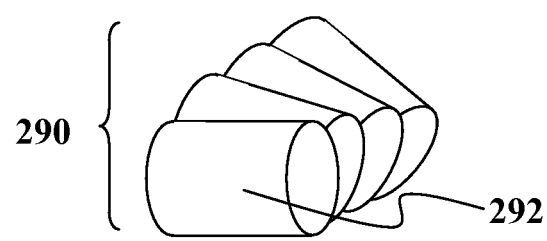

FIG. 11B shows yet another embodiment of the invention wherein the guide 290 comprises of a plurality of discrete elements 292 that are oriented to provide the same curving the substrate 50 to achieve the same functionality as that of guide 280. By way of example and not limitation, the discrete element 292 may be a roller, bearing, drum, or fixed roller. Other rotatable, fixed, or other shaped discrete elements may be used to guide the substrate 50. The guides may be any of a series of smooth surfaces, angled surfaces, rounded surfaces, the like, or combinations of the foregoing to achieved the desired configuration for substrate 50. Again, any of the surfaces of the elements in FIGS. 11A and 11B may also be coated or made of a low-friction material as described for surface 281.

Figure 12A:
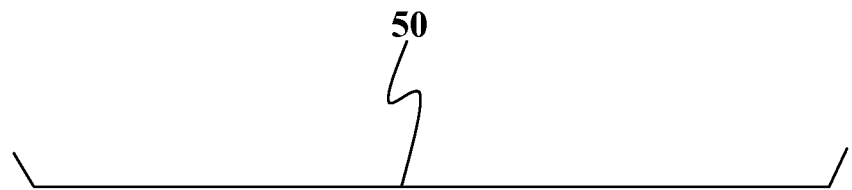
FIGS. 12A-12C show various configurations for a substrate with upwardly shaped edges.
Figure 12B:
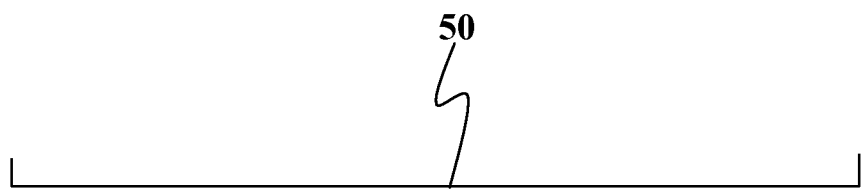
Figure 12C:
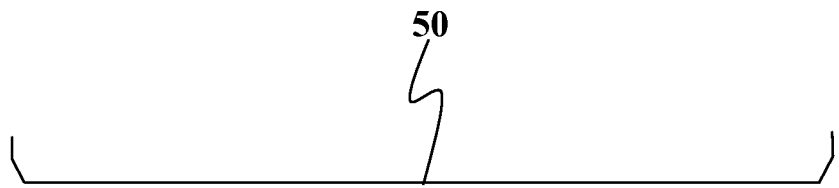

Referring now to FIGS. 12A-12C, it should be understood that the guides herein may be configured provide a variety of different geometries. FIG. 12A shows that the substrate 50 may have angled but substantially straight upward extending edge 293. FIG. 12B shows that the substrate 50 may have a vertical but substantially straight upward extending edge 295. FIG. 12C shows that the substrate 50 may have a multi-bend upward extending edge 297. It should be understood that other geometries of straight or curved sections may be combined in any order to create the desired cross-sectional profile for the substrate 50. The upward extending portion of the substrate 50 may be at any angle so long as it is sufficient to contain or constrain the fluid over the substrate 50. It should be understood that the amount of upward bending portion (on each side) may be described as a percentage of the cross-web width of the substrate such as but not limited to between 1% to 7% of the web width, with a minimum in this embodiment of at least 1 mm. Optionally, it may be between 2% to 6% of the web width, with a minimum in this embodiment of at least 2 mm. Optionally, it may be between 3% to 6% of the web width, with a minimum in this embodiment of at least 3 mm.

Figure 13:
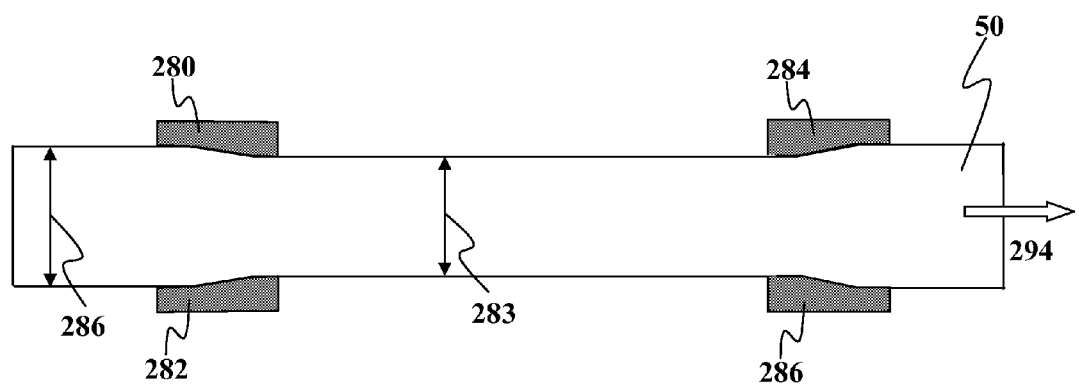
FIGS. 13 and 14 are top down views of a processing system showing locations of the substrate shaping assemblies according to embodiments of the present invention.

FIG. 13 shows that the guides 280 and 282 may be positioned to narrow the substrate 50 to achieve the curved configuration with the curved edges 53 and 55. Guides 284 and 286 are similar to the guides 280 and 282, except that the configuration is reversed to gradually uncurl the curved portions 53 and 55 and return the substrate 50 to a substantially planar configuration. By way of example and not limitation, it is desirable that the curling and uncurling occur in a manner that does not cause substantially permanent deformation that causes warping or damage to substantial portions of the substrate 50.

FIG. 13 also shows that when the edges of the substrate 50 is configured to have curved portions 53 and 55, the width 283 of the substrate 50 is less than the width 285 of the substrate 50 when planar. The movement of the substrate 50 is in the direction as indicated by arrow 294.

Figure 14:
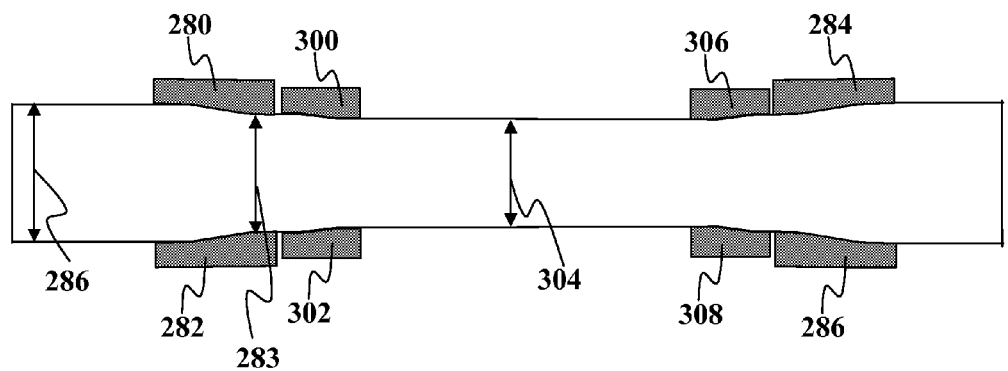

FIG. 14 shows that a cascade of one or more guides may be used to gradually curve the substrate 50. In this embodiment of the invention, the guides 280 and 282 are included. Additionally, a second set of guides 300 and 302 are included to further curl the substrate 50. This decreases the width to that indicated by arrows 304. FIG. 14 also shows the multiple guides 306, 308, 284, and 286 are used to uncurl, unbend, and/or uncurve a selected portion of the substrate 50.

Figure 15:
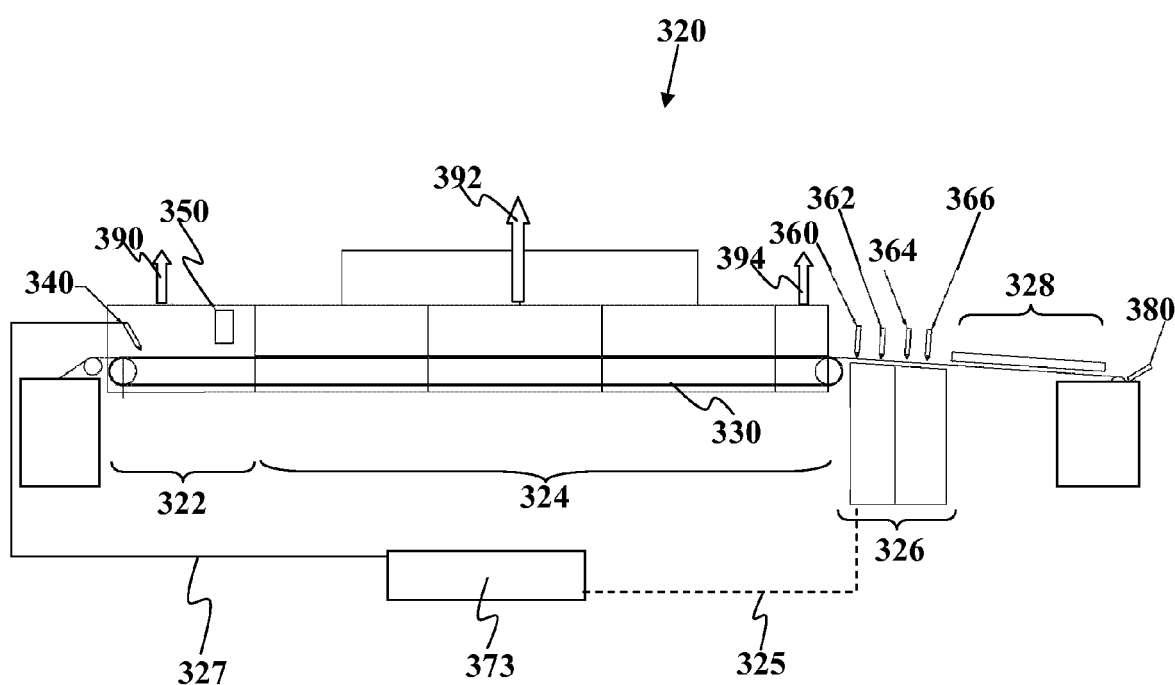
FIGS. 15 through 19 are side views of processing systems according to various embodiments of the present invention.

Referring now to FIG. 15, one embodiment of a deposition system 320 according to the present invention is shown. The deposition system 320 includes a deposition zone 322, a heated zone 324, a cleaning zone 326, and a drying zone 328. A belt system 330 is used to transport the substrate 50 through the heated zone 324. The deposition zone 322 may be located in an unheated zone. Optionally, it may be included in the heated zone 324.

FIG. 15 shows that in this embodiment an air knife or other gas source 340 may be used to clean off the surface of the substrate 50. The air knife or cleaning mechanism 340 may also be used to cool or temperature regulate the substrate 50 before fluid is deposited onto the substrate 50. This may be particularly useful as the belt system 330 may carry some heat from the heated zone 324. Optionally, in other embodiments, the belt system 330 may be sized such that the system 330 is housed mainly in the heated zone 324 and does not extend into the deposition zone 322 in manner that causes the substrate 50 to be heated prior to deposition of the fluid thereon. By way of example, the substrate 50 may be moved over a low-friction surface, free spanned in the deposition zone 322, transported by a separate conveyor system, or otherwise transported through the deposition zone 322. Some may have sections of the processing system that are without any conveyor system while other sections are conveyored. Some embodiments are entirely without conveyors. Some systems may have the non-conveyored system with a base have a pre-defined cross-section so as to curve or bend the substrate upward when the substrate is laid on or pulled to conform to the base.

In the present embodiment, the deposition assembly 350 used in the deposition zone 322 may be a variety of solution deposition devices. It should be understood that the fluid may be deposited by any of a variety of solution deposition techniques including, but not limited to, wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, ultrasonic spray deposition, and the like, as well as combinations of the above and/or related technologies. In one embodiment, a ultrasonic spray system such as but not limited to the Prism Ultra-Coat system available from Ultrasonic Systems, Inc. of Haverhill, Mass. may be used in the deposition assembly 350. Some embodiments may use more than one fluid deposition zone. They may use the same deposition technique or different techniques. Some embodiments may combine more than one deposition technique in the same deposition zone. It should also be understood that the fluid may be deposited at a temperature that is substantially the same as that of the substrate 50. Optionally, in other embodiments, the fluid may be cooler than the substrate 50 or hotter than the substrate 50. Some embodiments may heat the fluid so that it is warmer than the ambient temperature. Some embodiments may use an air knife to cool and/or clean the substrate prior to deposition of the fluid.

By way of example and not limitation, it should be understood that the heating zone 324 may use a variety of heating techniques. Some may use convection heating, infrared (IR) heating, or electromagnetic heating. Some embodiments may use chilled rollers or surfaces (not shown) on the underside of the substrate 50 to keep a lower portion of the substrate 50 cool while the upper portion is at a processing temperature. As seen in FIG. 15, there may be one or more separate zones in the heating zone 324. This allows for different temperature profiles during processing. In one embodiment, the heating elements may be positioned to heat all components in the heating zone to the same temperature. This includes the cover over the substrate, a muffle, or other elements used inside the heating enclosure. Again, heating may occur by convection heating, infrared (IR) heating, and/or electromagnetic heating.

Referring still to FIG. 15, after the substrate 50 passes through the heating zone 324, the cleaning zone 326 may use a combination of washing, blowing, rinsing, suction, cooling, shaping, heating, and/or other assemblies to post-treat the substrate 50 after the heating zone 324. In the present embodiment, a water sprayer 360 is used with an air knife 362. A second water sprayer 364 is used with a second air knife 366. This combination is designed to remove any excess fluid that is not reacted as the substrate 50 leaves the heating zone 324. The fluid and waste liquid being washed off will be collected by one or more liquid waste containers 370 and 372. The waste container 370 may be viewed as the primary waste container as it will contain a more concentrated waste fluid than the waste fluid filling the waste container 372. It should also be understood that in some embodiments, the fluid from containers 370 or 372 may be reconditioned in reservoir 373 for use again in the system. In one non-limiting example, used solution is cooled, and replenished in a solution container 373 and redirected into the deposition chamber.

There may be additional components such as filters on the return line 325, filters (not shown) on the feed line 327, or filters in fluid communication with reservoir 373 that may circulate the solution within the solution container 22 for the purpose of particle elimination, cooling, mixing etc. There may be a cooling loop with a cooling coil within the solution container 373. A cooling liquid may be circulated through the cooling coil to lower the temperature of the bath within the solution container 373. The temperature of the solution within the solution container 373 may be in the range of 5-40 C, preferably in the 15-20 C range. In effect the deposition section becomes a cold-wall reactor where only the wall carrying the structure to be coated with CdS is heated.

FIG. 15 also shows that in this embodiment of the invention, the substrate 50 is dried after passing through the cleaning zone 326. Drying zone 328 is positioned over the substrate 50 and will cure the material on the substrate 50. In one embodiment, the drying zone 328 uses a plurality of ultraviolet curing lamps to remove any residual moisture that may be on the substrate. Optionally, in another embodiment of the invention, heated gases may be circulated over the substrate 50 to remove any residual moisture from the substrate 50. Some embodiment may circulate heated inert gas such as but not limited to nitrogen. Optionally, some embodiments may merely circulate heated ambient air that is drawn into the drying zone 328.

It should also be understood that a variety of sensors may also be installed along the path that the substrate 50 travels through the deposition system 320. By way of nonlimiting example, this may include a thickness sensor 380 positioned to detect the thickness of the coated substrate. Optionally, other embodiments may use an optical sensor to detect surface imperfection on the coated substrate 50. FIG. 15 also shows that exhausts 390, 392, and 394 are positioned along the path of the substrate 50 to draw off waste gases that may be created during processing. Sensors may also be optionally present to optionally detect chemical composition either on surface and/or through depth of coating. Some embodiments may have optional sensor system to assess spatial uniformity (not just aberrations but also standard uniformity).

It should also be understood that some embodiments may have multiple heating zones 324. Some embodiments may have alternating zones 322 and 324. The zones may be combined various orders such as that shown in FIG. 6. Cleaning zones 326 may also be included after one or more of the heating zones 324.

Figure 16:
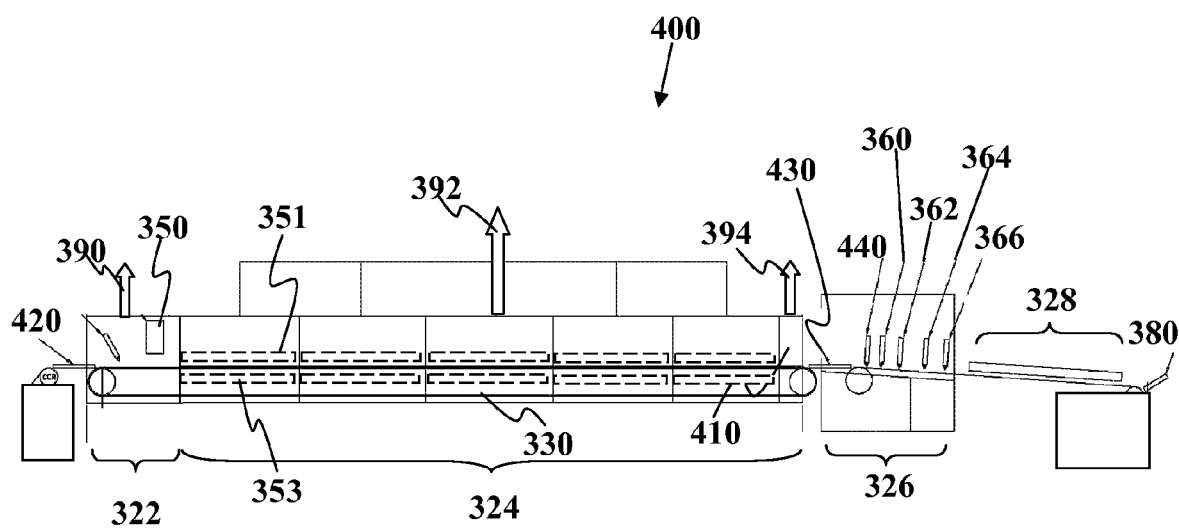

Referring now to FIG. 16, yet another embodiment of the present invention is now described. The deposition system 400 in FIG. 16 is similar in some aspect to the system 320 shown in FIG. 15. By way of example and not limitation, the heating zone 324 includes additional convention chambers therein. The exhaust 394 is connected to its own chamber 410. Deposition system 400 includes a substrate guide or contour device 420 located upstream of the heating chamber. This substrate contour device 420 will shape the edges of the substrate 50 to define an area over the substrate 50 to hold fluid thereon. A second substrate contour device 430 will uncurl the edges of the substrate 50 to return the substrate 50 to a substantially planar configuration. One other area of difference in the deposition system 400 involves the cleaning zone 326. The cleaning zone 326 in system 400 includes a suction element 440 for removing excess fluid from the substrate 50 after processing through the heating zone 324. This suction element 440 provides for increased control of fluid being removed from substrate 50 prior the washing and blowing elements similar to that of system 320.

Optionally, it should be understood that any of the embodiments herein may be equipped with thermally conductive coverplate(s) 351 which may include a plurality of fins or other heat transfer improving shapes or features to improve the heat transfer from the convection system to the substrate 50. The plates 351 may be made of a thermally conductive material such as but not limited to steel, aluminum, titanium, or the like. Optionally, in-line heating elements 353 may be also be included below and/or above the substrate to improve heat transfer to the substrate. They may be integrated to be part of the coverplates 351 or separate discrete elements. Some embodiment may also use free-spanning substrate 50 that is move without the use of a conveyor belt.

Figure 17:
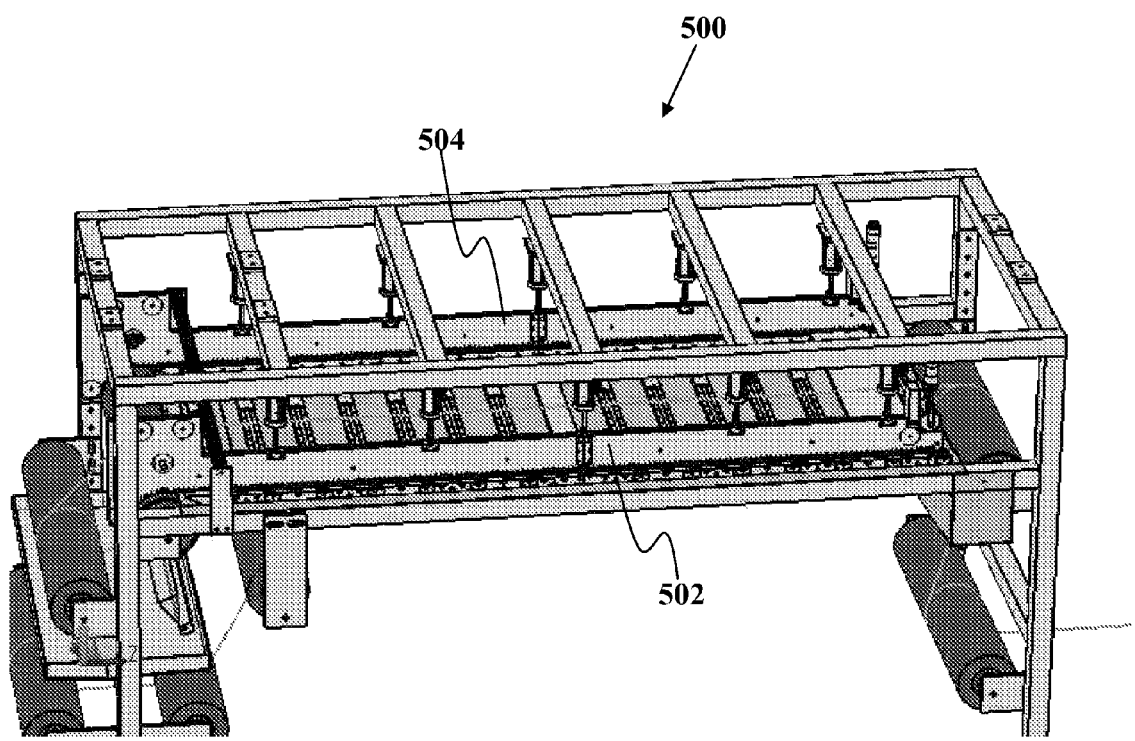

FIG. 17 shows a still further embodiment wherein a bath type deposition system 500 is used with moving seals 502 and 504. The moving seals 502 and 504 may cover the side, top, and/or bottom surfaces of the substrate 50 as seen more clearly in FIGS. 24-28. The path of the substrate 50 through the system 500 may be lowered to create a bath inside the system 500 without spillage downweb or upweb. Again, any solution deposition technique may be used. A variety of solution-based coating techniques may be used to apply the liquid including but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, ultrasonic spray deposition, and the like, as well as combinations of the above and/or related technologies. The surface of the substrate 50 can be modified by the addition of a wetting agent to the solution, such as glycerine. The liquid may also be a dispersion or ink containing the aforementioned materials. Depending on such surface tension, application of the liquid onto the substrate may optionally be conducted upside down. Heating of the web may occur after the deposition has occurred and/or at the same time. Optionally, the solution may itself be heated to a temperature above that of the substrate.

Figure 18:
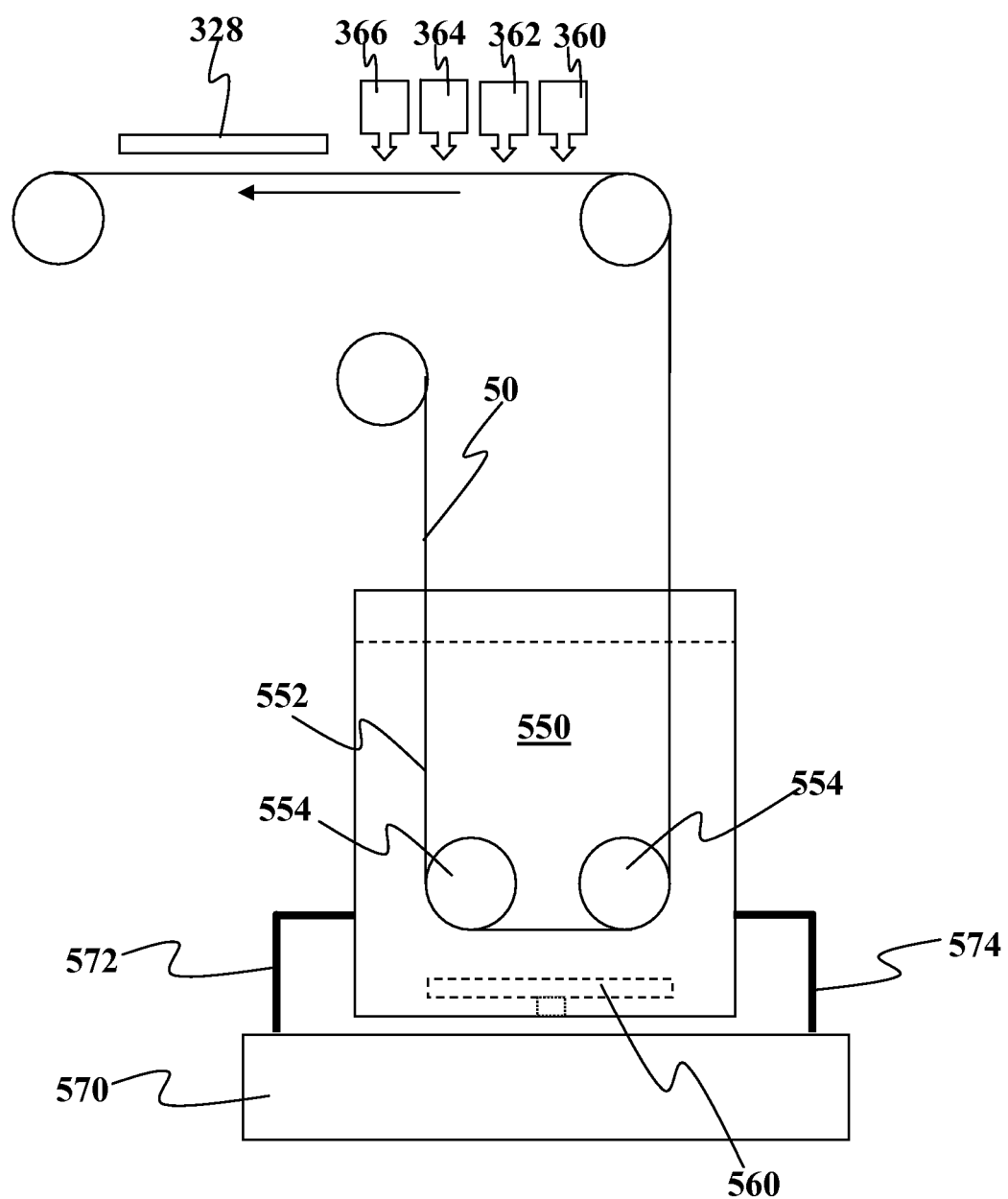

Referring now to FIG. 18, this embodiment shows that the substrate 50 may be passed through a bath 550 of Group IIB-VIA-based solution as shown. The rollers 552 are positioned so as to prevent contact the coated surface 554 of the substrate 50. Alternatively, some embodiments may allow the rollers 554 to contact the coated surface. FIG. 18 shows that this embodiment may optionally include a stirrer 560 to keep fluid moving around the surfaces of the container. FIG. 18 also shows that a reservoir 570 may be included to create fluid flow in the bath. Conduits 572 and 574 may be used to couple the bath 550 to the reservoir 570.

Figure 19:
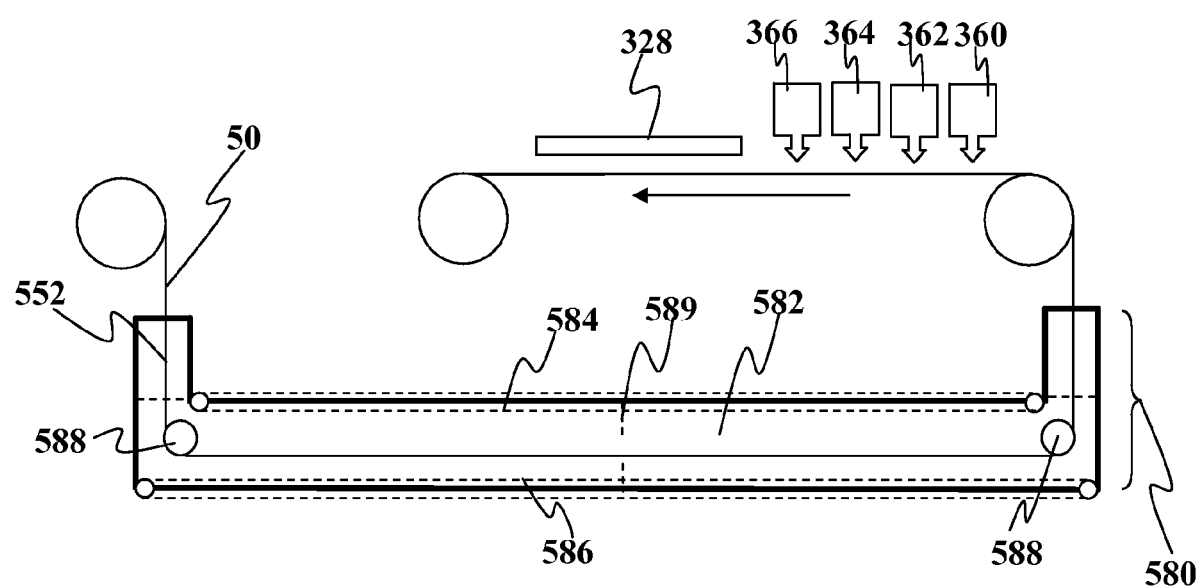

Referring now to FIG. 19, yet another embodiment of the present invention will now be described. FIG. 19 shows a shaped container 580 that contains a bath 582 therein. There may be movable surfaces 584 and/or 586 (shown in phantom) along the sides of the shaped container 580 to allow for deposits on those surfaces to be cleaned. Optionally, some embodiments may have normal wall surfaces, but the container 580 is frequently cleaned to remove and deposits formed thereon. Some embodiments may also be fitted with a reservoir similar to reservoir 570 to allow for constant fluid flow in the container 570 and more specifically along the walls of container 570 to minimize deposits thereon. Similar to FIG. 18, the rollers 588 may be configured not contact the coated surface 552 of the substrate 50. The shaped container also prevents fluid from escaping. Heating elements may be included in the bath or outside the container 580 to heat the bath 582 therein to the desired processing temperature. Some embodiments may have the same temperature throughout the bath 582. Optionally, other embodiments may have different heating zones that may include barriers 589 in the bath that separate different fluid zones that may have different temperatures. These embodiments may or may not use the substrate edge bending techniques previously described herein.

Figure 20:
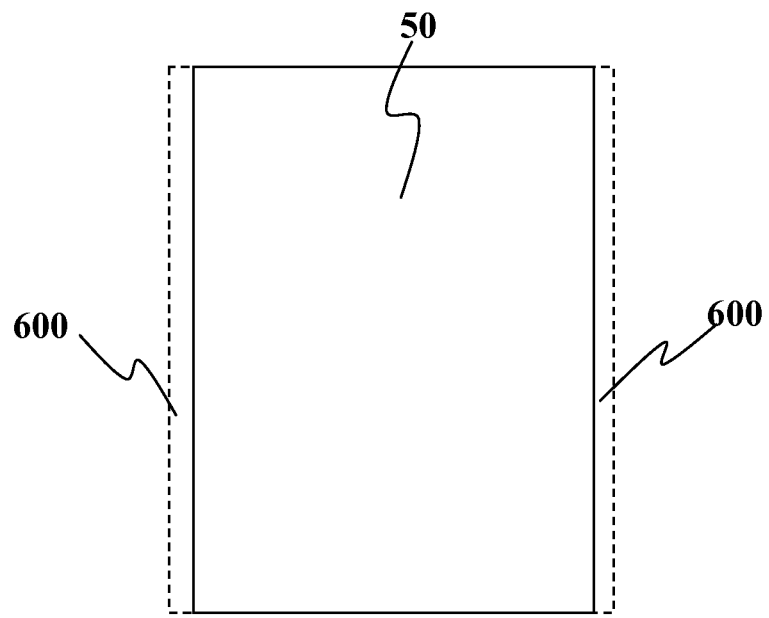
FIG. 20 shows a top down view of one portion of a substrate according to the present invention.

FIG. 20 shows a still further embodiment wherein an additional material 600 is coupled to the edges of the substrate 50. This allows for the material 600 to define the curved portion that allows a bath to be defined thereon. The material 600 may be a disposable material or reusable material. This minimizes the risk that the curling may scratch or damage the coating on the substrate 50. The material 600 may comprise of a variety of materials such as but not limited to Teflon, polymer, silicone, or other material. The material 600 may be coupled to the substrate 50 by adhesives or by heating.

Figure 21:
FIGS. 21 and 22 show a cross-web view of the substrate according to embodiments of the present invention.

As seen in FIG. 21, the material 600 may be in the form a sheet that covers the entire backside of the substrate 50 and extends beyond the edges of the substrate 50. This may be particularly useful when the substrate 50 is a plurality of pre-formed, discrete, or pre-cut rigid substrates and the material 600 is a pliable material to allow for curving to define a zone over the substrate for holding the fluid. The material 600 may act as a carrier on which pre-formed, discrete, or pre-cut substrates may be placed. The carrier may then carry these pre-formed, discrete, or pre-cut substrates through the processing station(s). In some embodiments, the edges of the material 600 may be pre-shaped to have the upward bending configuration and not separate curling apparatus is need to help transform the material 600 from a planar configuration to one with upwardly pointing edges.

Figure 22:

FIG. 22 shows that another embodiment of the invention may use the substrate 50 with strips of material 602 and 604 instead of an entire backside sheet of material 600. The material 602 and 604 may be similar to that used for material 600. The material 602 and 604 may be sufficiently flexible to allow the upward extending portion to be formed and allow a bath to be contained therein. This edge material may optionally be disposable so that the materials 602 and 604 may be handled more aggressively to get the desired throughput or shape. The same may also be said of material 600 in embodiments where it is designed to be disposable.

Figure 23A:
FIGS. 23A and 23B show a cross-web view of the substrate according to embodiments of the present invention.

Referring now to FIG. 23A, it should be understood that some embodiments may use a separate layer 610 that is attached to the backside of the substrate 50. This provides backside protection of the substrate 50, may also prevent unwanted formation of junction partner material on the backside, to act as a thermal mass to cool the backside, or to protect the backside during the curling or uncurling process. This backside material may be permanently attached to the substrate 50 or it may be a disposable material that is removed. Some embodiments may have the material dissolve away during processing.

Figure 23B:
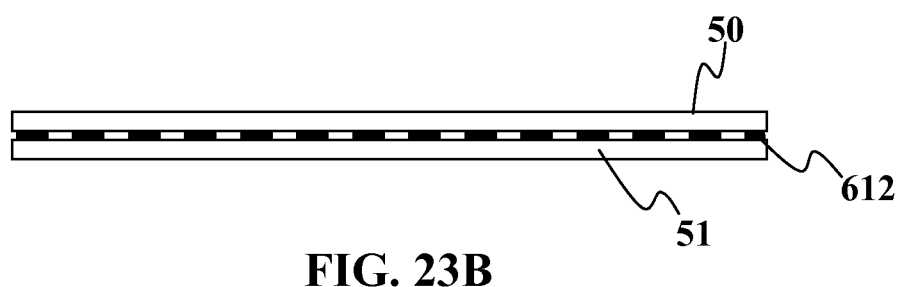

FIG. 23B shows that two substrates 50 and 51 may be joined together. Coating or otherwise treating both sides of one substrate can result in waste of valuable reactants or may lead to extra processing steps such as removing unwanted coatings. To avoid such waste or undesired processing, two substrates may be attached together "back-to-back" to form a dual substrate having, in effect, two front sides with the back sides protected against undesired treatment. Optionally, the substrates are attached in a manner that allows them to be separated from each other after processing. By way of example the substrates may be attached with a low-strength adhesive or electrostatic film applied to the back side of one or both substrates. Alternatively, an edge where the two substrates join may be sealed, e.g., with a tape, so that reactants cannot reach the back sides during processing. The dual substrate 50 and 51 may then be introduced into the bath and coated such that both front surfaces are treated while the back surfaces are not. Processing the substrate in this fashion may reduce the waste of reactants and may increase the area of the substrate that can be processed at one time. The substrates may be joined directly together or may have an adhesive layer 612 therebetween.

Figure 24:
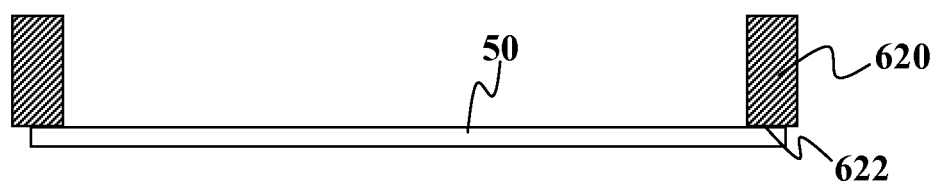
FIGS. 24 through 28 show various methods for edge sealing against the lateral edges of the substrate according to embodiments of the present invention.
Figure 25:
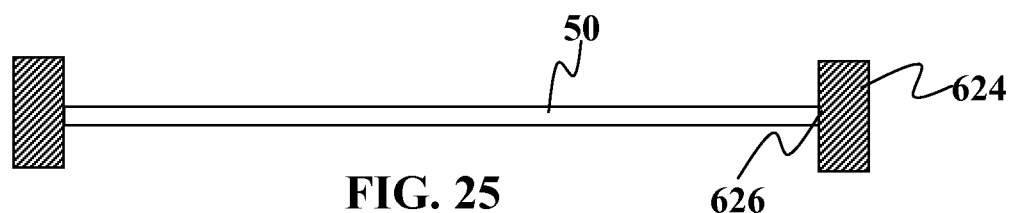

FIGS. 24 through 28 show some of the various types of edge seals that may be used with the substrate 50 or with substrate 50 and a disposable edge material to allow for a bath to be formed over the substrate 50. FIG. 24 shows that seal material 620 may be slidably or fixably attached to an upper surface 622 of the edge of the substrate 50. FIG. 25 shows that seal material 624 may be slidably or fixably attached to a side surface 626 of the edge of the substrate 50.

Figure 26:
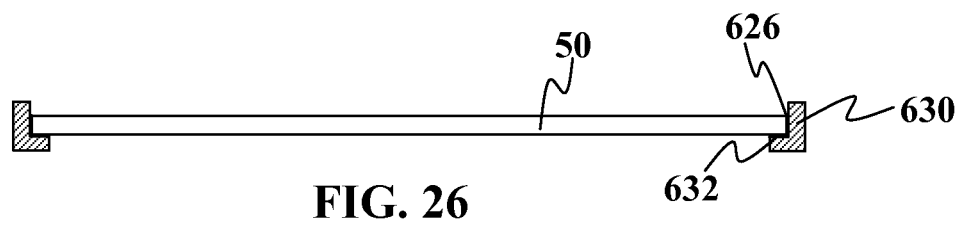
Figure 27:
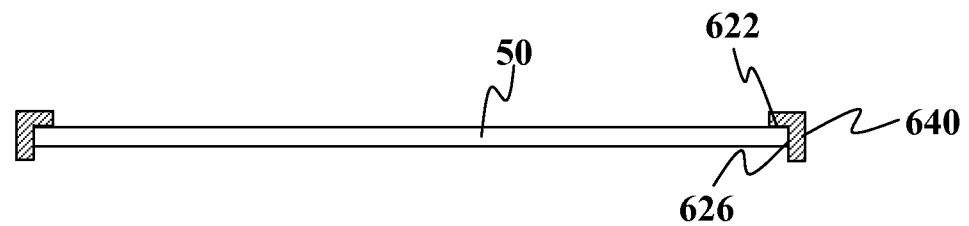
Figure 28:
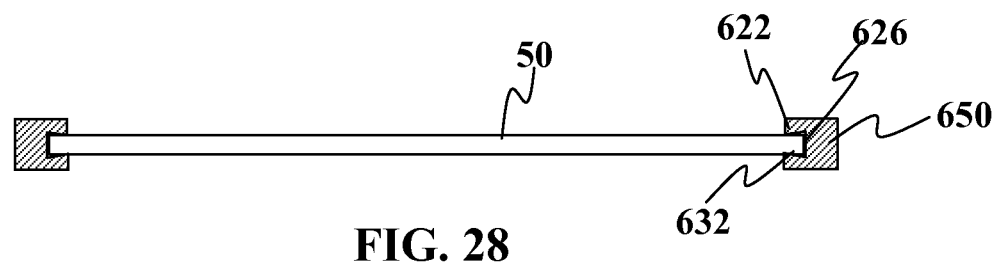

FIG. 26 shows that shaped seals 630 formed against a side surface 626 and/or a bottom surface 632 of the substrate 50. The seals 630 may be slidably or fixably attached to the substrate 50. FIG. 27 shows that a shaped seal 640 may be formed against a side surface 626 and/or a top surface 622 of the substrate 50. The seals 640 may be slidably or fixably attached to the substrate 50. FIG. 28 shows that a shaped seal 650 may be formed against a side surface 626, and/or a top surface 622, and/or a bottom surface 632 of the substrate 50. The seals 640 may be slidably or fixably attached to the various surfaces of substrate 50. Optionally, the surfaces of shaped seal 650 engaging the surfaces of substrate 50 may be angled and not necessary parallel to the surfaces against which they engage. This may created a pinched contact if a tighter engagement is desired.

Figure 29:
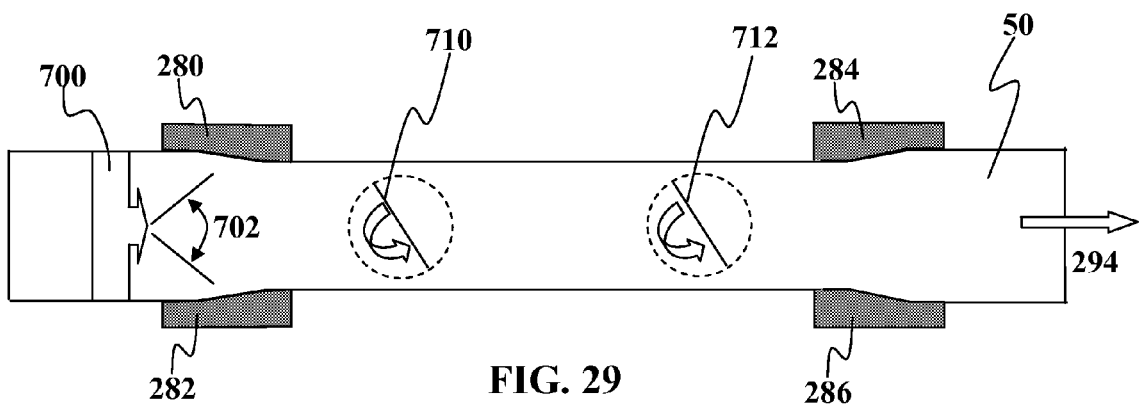
FIGS. 29 and 30 show embodiments of the present invention with stirring mechanisms along the substrate path.

Referring now to FIG. 29, yet another embodiment of the present invention will now be described. FIG. 29 shows a top-down view of the substrate 50 as it is being processed for formation of the junction partner layer. This embodiment has a single fluid deposition source 700 that directs fluid onto the substrate 50. The source 700 may be oriented to direct fluid downstream. This may be as a result of a slight angle of the deposition system as seen in FIG. 3 and may help to prevent flow of fluid upstream to un-contained areas where fluid may flow off the sides of the substrate 50. The fluid deposition source 700 may also be designed to have a reciprocating feature wherein the direction of the deposition will move through a series of angles 702 to more evenly distribute fluid over the substrate 50.

FIG. 29 also shows that one or more rotational stirring elements 710 and 712 may also be included in the present invention. The stirring elements 710 and 712 may be the same or different size. They may be positioned to create gas or air flow over the bath of fluid covering substrate 50. This may be helpful in creating convection or flow to more evenly distribute heat uniformly over the substrate 50. Optionally, the stirring elements 710 and 712 may be fully in or at least partially stirring the fluid over the substrate 50. They may be configured to rotate in the same or different directions. Other, non-rotation devices may also be used to create liquid flow or gas flow.

Figure 30:
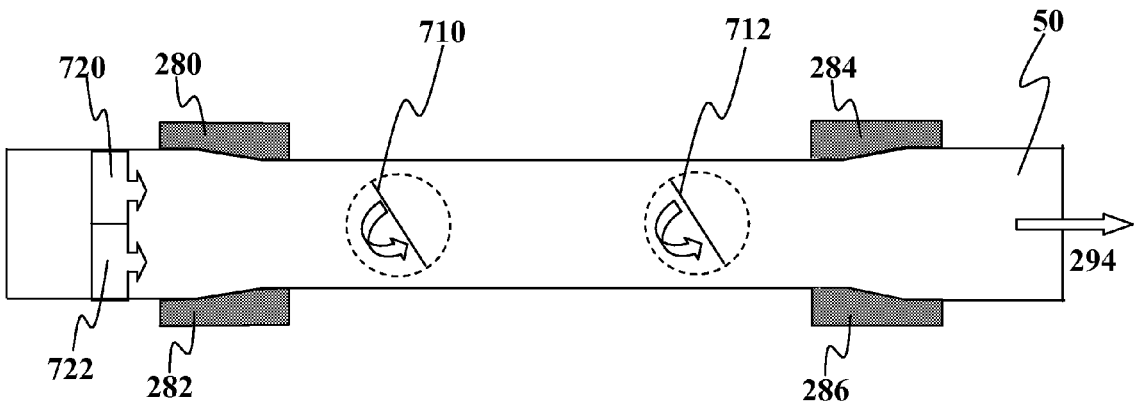

FIG. 30 shows a still further embodiment wherein there is more than one fluid deposition assembly 720 and 722 which are positioned at locations along the length and/or width of substrate 50. This may achieve a desired even distribution of fluid over the substrate 50. Some embodiments may have two or more fluid depositions assemblies. One or more the fluid deposition assembly 720 and 722 may be movable across different angles 702, similar to that as shown in the embodiment of FIG. 30. For any of the embodiments herein, a static or active mixer may be used upstream of the deposition assemblies to mix the fluids together prior to deposition onto substrate 50.

Figure 31:
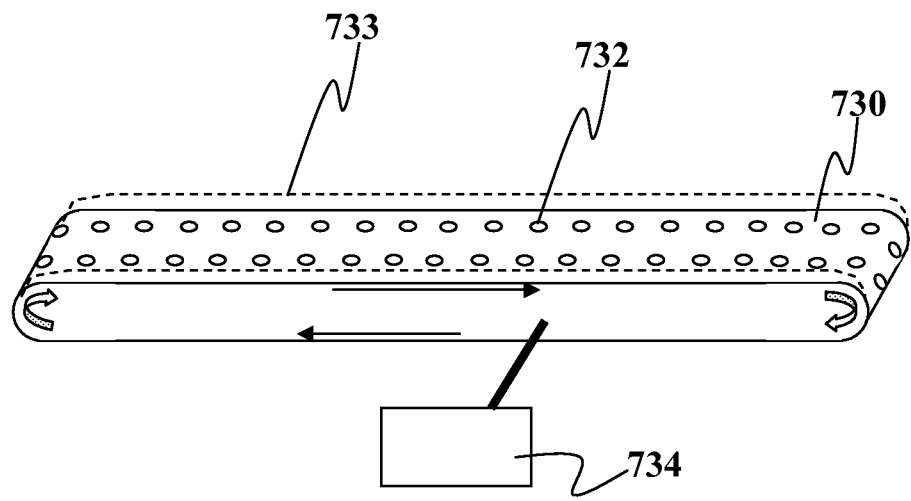
FIG. 31 shows one embodiment of a vacuum belt suitable for use with an embodiment of the present invention.

Referring now to FIG. 31, yet another aspect of the present invention will now be described. FIG. 31 shows a conveyor belt 730 with vacuum holes 732 therein to allow for suction of a substrate 50 thereon. This is useful to facilitate transport of the substrate 50 without scratching the underside. The vacuum holes 732 in the belt are suctioned by way of a vacuum source 734. The conveyor belt 730 may be sized to be the same as or almost the same width as the substrate 50. Optionally, it may be wider than the substrate 50. Optionally, belts 730 that are less wide may also be used. The thinner belts 730 may be used to suction down the substrate 50 at various strategic locations. Some embodiments may also use shaped conveyors which provide the desired contour at the edges of the substrate 50. Such shaped conveyors may have a lip 733 (shown in phantom) that may help to maintain the contour of the substrate 50 being transported by the conveyor. In some embodiments, the conveyor may be made of a thermally conductive material such as but not limited to a metal belt of titanium, stainless steel or the like. Optionally, the conveyor may be made of a polymer or thermally insulating material.

Figure 32:
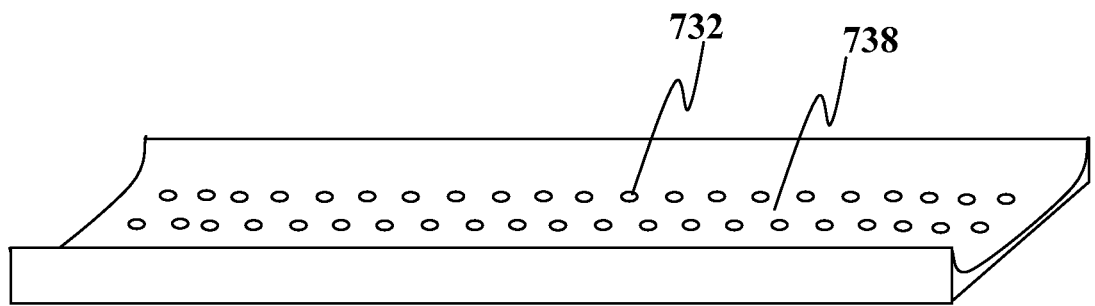
FIG. 32 shows one embodiment of a vacuum guide suitable for use with an embodiment of the present invention.

Optionally as seen in FIG. 32, on some very low surface transport surfaces, instead of using vacuum holes on the belts, the vacuum holes 732 may optionally be formed onto the low-friction surface 738. In one embodiment, the low-friction surface may be a Teflon® surface. Optionally, it may a surface with a static coefficient of friction between about 0.12 to about 0.20. Optionally, it may a surface with a static coefficient of friction between about 0.10 to about 0.30. This may allow the substrate to be held flat as it is pulled across the transport surface. This may be of particular use since the substrate 50 may be somewhat non-flat after processing.

Figure 33:
FIG. 33 shows a web path through one embodiment of processing system according to the present invention.

Referring now to FIG. 33, a still further aspect of the present invention will now be described. This shows that a substrate 50 may be taken along a path that dips to allow for a bath to be created at recessed area to minimize the loss of process fluid either upstream or downstream. This dip 740 in the path may be achieved through the use of rollers or other web guiding devices to direct the substrate 50 to a lower pathway. The substrate 50 may remain at this lower level and the rise upward vertically or at an angle to rise out of the lower path.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, the present invention may be adapted for use with superstrate or substrate designs. The tool designs of this invention may be used for continuous, in-line processing of substrates which may be in the form of a web or in the form of large sheets such as glass sheets. The substrate may be a continuous web or sheet of a metal or an insulator comprising a precursor layer that has been reacted to form a compound film absorber layer. The present invention is not limited to deposition of junction partner material. By way of nonlimiting example, it may also be used to deposit precursor materials for photovoltaic absorber layers. Optionally, it may be used to deposit materials for use as or precursor materials that form: anti-reflective coatings on cells or modules, moisture barriers on such modules or devices, encapsulant materials, adhesive materials, conductive materials, insulating materials, and/or semiconducting material.

For any of the embodiment herein, the substrate may be an elongate material suitable for use in a continuous, roll-to-roll process. Optionally, there may be a carrier on which discrete or pre-cut substrates comprising the precursor layers may be placed. The carrier may then carry these discrete or pre-cut substrates through the processing station(s). The carrier may be the same or a different material from the discrete, pre-cut, or individual substrate. The carrier may be sufficiently pliable to be shaped to create the zone to hold sufficient fluid on the carrier to submerge the discrete or pre-cut substrates in processing fluid. In any of these embodiments, the substrate may be moved continuously at the same or different rate, or optionally in sequential stop and go steps.

The heating steps and cooling steps may be repeated either for depositing thicker CdS on the same surface or for depositing CdS on surfaces of new structures introduced into the deposition section in a cyclic or continuous manner. Optionally, some embodiments may use continuous recycling of the solution between the solution container collecting used solution and the deposition section, although intermittent flow of the solution between the deposition section and the solution container may also be utilized. Once the solution is in the recirculating solution container it may be analyzed for its composition and ingredients that may be reduced due to reactions may be added to the solution. Such ingredients include but are not limited to water, ammonia, Cd salt, S source, complexing agent etc. By controlling the solution composition this way, the same solution may be used for coating a large number of structures with CdS without replacing the base solution. This reduces waste and thus cost of the process. The base solution may be occasionally replaced with a fresh one if its impurity content increases to a level that may affect the quality of the deposited CdS film. Removal of particles from the solution may be achieved through filtration using various approaches including centrifuging the solution. The CdS particles thus removed may be re-cycled later to form a Cd source for the process.

With regards to the type of various junction partner suitable for use with the present invention, various chemical compositions have been evaluated in solar cell structures. CdS, ZnS, Zn—S—OH, Zn—S—O—OH, ZnO, Zn—Mg—O, Cd—Zn—S, ZnSe, In—Se, In—Ga—Se, In—S, In—Ga—S, In—O—OH, In—S—O, In—S—OH, etc. are some non-limiting examples of possible materials. Such layer may be in the thickness range of about 5-200 nm thick and may be deposited by various techniques such as evaporation, sputtering, atomic layer deposition (ALD), electrodeposition and chemical bath deposition (CBD), etc In one example, a suitable solution for growing a cadmium sulfide (CdS) layer employs a chemical bath comprising cadmium (Cd) species (from a Cd salt source such as Cd-chloride, Cd-sulfate, Cd-acetate, etc.), sulfur (S) species (from a S source such as thiourea) and a complexing agent (such as ammonia, triethanolamine (TEA), diethanolamine (DEA), ethlene diamine tetra-acetic acid (EDTA), etc) that regulates the reaction rate between the Cd and S species. In one example, the deposition bath may be formed by mixing in water 1-50 ml of 1 M cadmium salt solution, such as Cd-chloride, Cd-sulfate, Cd-acetate, or the like, 1-50 ml of 14.53 M ammonium hydroxide solution as complexing agent, and 1-50 ml of 1M thiourea as S solution. Another complexing agent solution such as 0.5M Triethanolamine (TEA) may also be added in an amount that is in the range of 1-20 ml. A typical bath may contain (by volume) 5-15% cadmium solution, 5-15% complexing agent (ammonium hydroxide), 5-15% S solution (thiourea) and optionally 5-10% of the additional complexing agent solution (TEA), the balance being the solvent, i.e. water.

Furthermore, those of skill in the art will recognize that any of the embodiments of the present invention can be applied to almost any type of solar cell material and/or architecture. For example, the absorber layer in solar cell 10 may be an absorber layer comprised of silicon, amorphous silicon, organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, Cu(In,Ga)(S,Se)$_2$, Cu(In,Ga,Al)(S,Se,Te)$_2$, other absorber materials, IB-IIB-IVA-VIA absorber solar cells, other thing film solar cells, and/or combinations of the above, where the active materials are present in any of several forms including but not limited to bulk materials, micro-particles, nano-particles, or quantum dots. The CIGS cells may be formed by vacuum or non-vacuum processes. The processes may be one stage, two stage, or multi-stage CIGS processing techniques. Additionally, other possible absorber layers may be based on amorphous silicon (doped or undoped), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or C$_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Many of these types of cells can be fabricated on flexible substrates.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. . . . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. For example, U.S. patent application Ser. No. 12/203,117 filed Sep. 2, 2008 is fully incorporated herein by reference for all purposes.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A deposition system for use with a solution and a substrate, the system comprising:
   a drip based solution deposition apparatus;
   at least one heating chamber;
   at least one assembly for holding a solution over the substrate; and
   a substrate curling apparatus for curling at least one edge of the substrate to define a zone capable of containing a volume of the solution over the substrate;
   a roll-to-roll substrate transport mechanism configured such that the substrate extends from a supply roll wherein the substrate is unwound from an uncurled lateral edge configuration, the substrate extends through the substrate curling apparatus and at least a portion of the heating chamber in a curled lateral edge configuration, and the substrate extends to a rewind roll wherein the substrate is wound with the uncurled lateral edge configuration;
   wherein the solution is on the substrate while the substrate is being moved through the heating chamber.

2. The system of claim 1 wherein the assembly curls at least two edges of the substrate.

3. The system of claim 1 wherein the assembly for holding solution over the substrate to allow for a depth of at least about 0.5 microns to about 10 mm.

4. The system of claim 1 wherein the assembly for holding solution over the substrate to allow for a depth of at least about 1 mm to about 5 mm.

5. The system of claim 1 wherein the curling apparatus curls opposing edges of the substrate.

6. The system of claim 5 wherein the curling apparatus is configured to transition a planar substrate to a substrate with curls along two edges, wherein the transition occurs over a distance sufficient prevent permanent deformation of the substrate when the substrate is uncurled.

7. The system of claim 5 wherein the curling apparatus is configured to transition a planar substrate to a substrate with curls along two edges over a distance of at least 4 inches.

8. The system of claim 5 wherein the curling apparatus is configured to transition a planar substrate to a substrate with curls along two edges over a distance of at least 6 inches.

9. The system of claim 5 wherein the curling apparatus creates curls of sufficient height to contain the volume of solution therein without allowing the solution to spill over an upper of the curl.

10. The system of claim 5 wherein the assembly for holding solution further comprises of an uncurling apparatus for uncurling at least two edges of the substrate to return the substrate to a substantially planar configuration.

11. The system of claim 5 wherein the curling apparatus comprise of a web guide.

12. The system of claim 5 wherein the curling apparatus comprise of a shaped web guide.

13. The system of claim 1 wherein the solution deposition apparatus comprises of a spray deposition system to deposit the solution over the substrate such that the substrate has the solution on it when the solution is in the curled lateral edge configuration.

14. The system of claim 1 wherein the solution deposition apparatus comprises of an ultrasonic spray deposition system to deposit the solution over the substrate such that the substrate has the solution on it when the solution is in the curled lateral edge configuration.

15. The system of claim 1 wherein the solution deposition apparatus has a laterally moving deposition head or nozzle such that the substrate has the solution on it when the solution is in the curled lateral edge configuration.

16. The system of claim 1 wherein the solution deposition apparatus has an angularly moving deposition head or nozzle such that the substrate has the solution on it when the solution is in the curled lateral edge configuration.

17. The system of claim 1 wherein the solution comprises a precursor for forming a junction partner for a group IB-IIIA-VIA absorber layer.

18. The system of claim 1 wherein the solution comprises a precursor for forming a Group IIB-VIA junction partner.

19. The system of claim 1 wherein the solution comprises a precursor for forming a junction partner selected from the group consisting of: cadmium sulfide (CdS), zinc sulfide (ZnS), zinc hydroxide, zinc selenide (ZnSe).

20. The system of claim 1 wherein the solution comprises of a Group IIB ionic species is obtained from an aqueous solution of one or more of the following: sulfate, acetate, bromide, fluoride, chloride, iodide, hydroxide, nitrate, oxalate, citrate, phosphate, tungstate, or hydrates of the Group IIB species.

* * * * *